United States Patent [19]
Torii et al.

[11] Patent Number: 5,952,245
[45] Date of Patent: Sep. 14, 1999

[54] METHOD FOR PROCESSING SAMPLES

[75] Inventors: Yoshimi Torii, Tachikawa; Kazuo Nojiri, Higashimurayama; Yoshinao Kawasaki, Yamaguchi; Yoshiaki Sato, Kudamatsu; Ryooji Fukuyama, Kudamatsu; Hironobu Kawahara, Kudamatsu, all of Japan

[73] Assignee: Hitachi, Ltd., Tokyo, Japan

[21] Appl. No.: 08/721,584

[22] Filed: Sep. 25, 1996

Related U.S. Application Data

[60] Continuation of application No. 08/470,443, Jun. 6, 1995, which is a division of application No. 07/987,171, Dec. 8, 1992, which is a continuation-in-part of application No. 07/638,378, Jan. 7, 1991, Pat. No. 5,200,017, which is a division of application No. 07/477,474, Feb. 9, 1990, Pat. No. 5,007,981.

[30] Foreign Application Priority Data

Feb. 27, 1989 [JP] Japan ................................ 1-42976
Feb. 4, 1992 [JP] Japan ................................ 4-017997

[51] Int. Cl.⁶ ........................................... H01L 21/461
[52] U.S. Cl. ........................... 438/720; 438/718; 134/1.2
[58] Field of Search ...................... 156/643.1, 646.1, 156/650.1, 651.1, 656.1; 216/67, 77; 134/1.1, 1.2, 2; 438/710, 704, 718, 720

[56] References Cited

U.S. PATENT DOCUMENTS

| | | | |
|---|---|---|---|
| 4,428,796 | 1/1984 | Milgram | 430/314 |
| 4,481,070 | 11/1984 | Thomas et al. | 156/643.1 |
| 4,487,678 | 12/1984 | Noguchi et al. | |
| 4,722,355 | 2/1988 | Moe et al. | 134/73 |
| 4,816,098 | 3/1989 | Davis et al. | 156/345 |
| 4,855,252 | 8/1989 | Peterman et al. | 437/189 |
| 5,007,981 | 4/1991 | Kawasaki et al. | 156/643.1 |
| 5,200,017 | 4/1993 | Kawasaki et al. | 156/345 |
| 5,252,881 | 10/1993 | Muller et al. | 310/309 |

FOREIGN PATENT DOCUMENTS

| | | |
|---|---|---|
| 0187249 | 11/1985 | European Pat. Off. . |
| 0219826 | 10/1986 | European Pat. Off. . |
| 247603 | 5/1987 | European Pat. Off. . |
| 57-2585 | 7/1982 | Japan . |
| 60-145625 | 8/1985 | Japan . |
| 63-9121 | 1/1988 | Japan . |
| WO84/01084 | 3/1984 | WIPO . |

OTHER PUBLICATIONS

Patent Abstracts of Japan, JP–A–55 072040, vol. 004, No. 117 (E–022), Aug. 20, 1980, Mitsubishi Electric Corp.
Database WPI, Derwent Publications Ltd., JP–A–63 157870, Jun. 30, 1988, Nichiden Anelba KK. (Abstract).
Database WPI, Derwent Publications Ltd., JP–A–63 204726, Aug. 24, 1988, Anelva Corp. (Abstract).
Elliot, David J., "Integrated Circuit Fabrication Technology" © 1982, pp. 57–59, 256–257, 267, 270–275.

*Primary Examiner*—Bruce Breneman
*Assistant Examiner*—Luz Alejandro
*Attorney, Agent, or Firm*—Antonelli, Terry, Stout & Kraus, LLP

[57] ABSTRACT

Disclosed is apparatus for treating samples, and a method of using the apparatus. The apparatus includes processing apparatus (a) for treating the samples (e.g., plasma etching apparatus), (b) for removing residual corrosive compounds formed by the sample treatment, (c) for wet-processing of the samples and (d) for dry-processing the samples. A plurality of wet-processing treatments of a sample can be performed. The wet-processing apparatus can include a plurality of wet-processing stations. The samples can either be passed in series through the plurality of wet-processing stations, or can be passed in parallel through the wet-processing stations.

11 Claims, 13 Drawing Sheets

ACETIC ACID CONCENTRATION AND CORROSION OCCURRENCE PERCENTAGE IN ACETIC ACID WASHING

BUFFER ACTION ACETIC ACID AMMONIUM

FIG. 15

(a) ETCHING ON TABLE 15: A | B | C | D | E | F | G (b) ASHING ON TABLE 22: A | B | C | D | E | F (c) RINSING ON TABLE 32a: A | C | E (d) RINSING ON TABLE 32b: B | D

TIME →

METHOD FOR PROCESSING SAMPLES

This application is a Continuation application of application Ser. No. 08/470,443, filed Jun. 6, 1995, which is a Divisional application of application Ser. No. 07/987,171, filed Dec. 8, 1992, which is a Continuation-in-Part application of application Ser. No. 07/638,378, now U.S. Pat. No. 5,200,017 filed Jan. 7, 1991, the contents of which are incorporated herein by reference in their entirety, which is a Divisional application of application Ser. No. 07/477,474 filed Feb. 9, 1990, now U.S. Pat. No. 5,007,981.

BACKGROUND OF THE INVENTION

This invention relates to a method of processing a sample including an etching step, and to an apparatus for carrying out such a method, and more particularly to a processing method and apparatus which is suitable for processing a sample in the manufacture of a semiconductor device or other device including miniaturized components.

A sample such as a semiconductor device substrate is etched by a chemical solution or by plasma, for example. Sufficient care must be paid to corrosion protection of the sample after etching processing.

A corrosion-proofing technique after etching is disclosed, for example, in U.S. Pat. No. 4,487,678. This technique subjects a resist film, after etching by plasma inside an etching chamber, to removal in a second plasma processing chamber connected to the etching chamber. The second plasma treatment removes chlorine compounds which are corrosive components remaining in the resist film or on the etched surface. It is also known to heat the sample after etching to at least 200° C. in order to promote evaporation of chlorides that are residual corrosive components. Japanese Laid-Open Patent Publication No. JP-A-61-133388 discloses a method in which a sample after plasma etching is transferred to a heat-treating chamber in which hot air is blown on it to remove corrosive compounds. Thereafter the sample is washed with water and dried.

The present applicants have found that these aforementioned techniques involve the problem that sufficient corrosion-proofing performance cannot be obtained, at least for certain kinds of samples.

For instance, the techniques described above are believed effective in some cases for corrosion-proofing of a single metallic film such as an aluminum (Al) wiring film. However, they fail to provide a sufficient corrosion-proofing effect after etching of a sample having metals having mutually different ionization tendencies such as films of Al, Cu, W, Ti, Mo, etc. and their alloys or laminates, e.g., as a laminate wiring structure.

With the remarkable progress in miniaturization in recent years, wiring films have been more and more miniaturized, and an Al—Cu—Si alloy film having a few percent of Cu content in place of the conventional Al—Si alloy film and a laminate structure of the Al—Cu—Si alloy film and a refractory metal film such as titanium tungsten (TiW), titanium nitride (TiN) and molybdenum silicon (MoSi) film for reducing contact resistance have gained wide application as a wiring film in order to prevent breakage due to electromigration and stress migration. In such a wiring film structure, ionization tendencies of Al and Cu, W, Ti, Mo or the like are different so that a battery action develops due to water acting as an electrolyte, and corrosion of the wiring film is accelerated by so-called "electrolytic corrosion". Even if corrosive materials generated by etching are removed by utilizing plasma at a high temperature of 200° C. or above, corrosion occurs due to the effect of moisture on remaining corrosive compounds within some minutes or several hours after the sample is withdrawn into the atmosphere.

As a countermeasure of the above "electrolytic corrosion" problem, there has been proposed, as disclosed in Japanese Laid-Open Publication No. Hei 2-2242233, a sample processing apparatus comprising means for processing a sample (e.g., etching processing the sample), means for post-processing a processed sample, the post-processing means utilizing a plasma, means for wet-processing a processed sample processed through the plasma post-processing means, and means for dry-processing a processed sample which has been processed through the wet-processing means. Corrosion of the sample after the etching processing, irrespective of the kind of the sample, can be prevented effectively utilizing this sample processing apparatus.

However, since the sample processing apparatus shown in the above-discussed Japanese Laid-Open Publication No. Hei 2-2242233 comprises a single means for wet-processing the sample processed through the plasma post-processing means, the through-put is limited; moreover, when the wet-processing time is lengthened, such that the corrosion-preventing effect is improved, a further problem is caused that the through-put is even further lowered.

SUMMARY OF THE INVENTION

It is an object of the present invention to provide a sample processing method and apparatus which can prevent sufficiently corrosion of a sample after etching irrespective of the kind of sample.

Another object of the present invention is to provide a sample processing method and apparatus wherein through-put of the processing can be increased without a loss in the corrosion-preventing effect.

The above and other objects of the present invention and novel features will be clear from the description of the present specification and also from the attached drawings. This description and drawings are not limiting of the invention, the scope of the present invention being defined by the claims.

Within the invention disclosed in the present application, an outline of a representative example will be explained in the following. This representative example illustrates, and is not limiting of, the present invention.

According to one aspect of the present invention, a sample processing apparatus comprises means for processing a sample (e.g., an etching processing means, such as a plasma etching means), means for plasma post-processing a sample, that has been processed through the processing means, under a reduced pressure condition, means for wet-processing a sample that has been processed through the plasma post-processing means and means for dry-processing a sample that has been processed through the wet-processing means. This aspect of the present invention includes techniques for using this apparatus.

According to a further aspect of the present invention, a sample processing apparatus can include means for processing a sample (e.g., an etching processing means, such as a plasma etching means); a plurality (e.g., two) of wet-processing means, for processing samples passed through the sample processing means; and, e.g., means for dry-processing a sample that has been passed through the wet processing means. This aspect of the present invention also includes methods of using this apparatus.

The plurality of wet processing means can be used in series, or can be used in parallel (that is, samples can alternatively be passed to one or another of the wet-processing means, e.g., to an unoccupied wet-processing means) to decrease processing time. In such use of wet-processing means in parallel, there is overlapping use of the wet-processing means. Through parallel use of the wet-processing means, at least two of the wet-processing means are used simultaneously on different samples, thereby decreasing total processing time for a plurality of samples, particularly where the wet-processing takes a longer time to perform than, e.g., the sample processing in the sample processing means.

As a further aspect of the present invention, the wet-processing can include a plurality of treatments (e.g., a chemical treatment in, e.g., an alkaline or acidic solution, together with a water rinse of a sample).

In parallel passing of the samples through the wet processing means, a plurality of wet processing treatments can be performed at a single wet processing means (station). In series passing of samples through the plurality of wet-processing means (stations), a single wet-processing treatment can be performed at each means; however, a plurality of wet-processing treatments can also be provided at each means.

According to the present invention, the samples can also be subjected to additional treatment (means) for removing residual corrosive compounds, formed, e.g., as a result of the sample processing (e.g., plasma etching), this additional treatment being performed between the sample processing and wet processing. This additional treatment can be a plasma processing, e.g., under a reduced pressure.

Passing of samples through the various processing stations can be controlled by a controller (e.g., a personal computer), as would be known by the ordinary worker in the art. This controller can be used to provide series or parallel passing of samples through the wet-processing means.

According to the present invention, within a series of processing steps comprising a step for processing a sample, a step for plasma post-processing a processed sample under a reduced pressure condition, a step for wet-processing a processed sample of the plasma post-processing means and a step for dry-processing a processed sample of the wet-processing means, in the wet-processing step (which could cause lowering of the through-put in the processing) plural wet-processing means are provided so that the lowering of the through-put in the processing does not occur; and, irrespective of the kind of the sample, it is possible to prevent effectively corrosion of the sample after the etching process.

In this description, a plasma treatment step, after sample processing (e.g., plasma etching), is called post-processing, the liquid treatment step is called wet-processing, and the drying step is called dry-processing, for convenience.

In the invention, a sample is etched by use of plasma. After etching, the sample is post-processed by plasma post-processing means by utilizing plasma under a reduced pressure. The post-processed sample from the plasma post-processing means is wet-processed by wet-processing means. The wet-processed sample is dry-processed by dry-processing means. Since post-processing using plasma and wet-processing are both carried out, the corrosive materials that occur due to etching can be removed sufficiently from the etched sample. Therefore, even when the etched sample is withdrawn into external air, for example, its corrosion can be sufficiently prevented irrespective of the kind of sample. Moreover, treatment time can be reduced.

BRIEF DESCRIPTION OF THE DRAWINGS

Embodiments of the present invention will be described below by way of non-limitative example with reference to the accompanying drawings, in which:

FIG. 15 schematically shows a processing sequence for parallel processing of samples, over a period of time, in a plurality of wet processing means (stations).

DESCRIPTION OF THE PREFERRED EMBODIMENTS

In the following, the present invention will be described in connection with preferred embodiments. The present invention is not limited to these preferred embodiments (which are illustrative of the invention), it being intended that the present invention is defined by the full scope of the appended claims and equivalents thereof.

Figure 1:
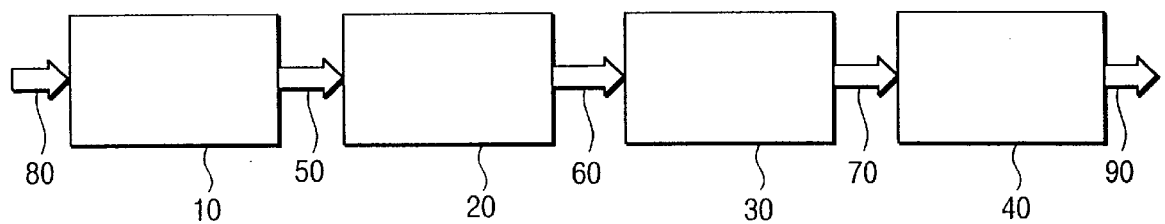
FIG. 1 is a block diagram of a first sample processing apparatus.

In FIG. 1, the sample processing apparatus includes a processing apparatus 10 for etching a sample, a plasma post-processing apparatus 20, a wet-processing apparatus 30 and a dry-processing apparatus 40 and is equipped at least with means 50, 60, 70 for transferring the sample between these processing apparatuses.

In FIG. 1, an apparatus for processing, such as etching, the sample by utilizing plasma under a reduced pressure is used as the processing apparatus 10. Examples of the plasma etching apparatuses which may be employed are a plasma etching apparatus, a reactive sputter etching apparatus, a non-magnetic field type microwave plasma etching apparatus, a magnetic field type microwave plasma etching apparatus, an electron cyclotron resonance (ECR) type microwave plasma etching apparatus, a photo-excitation plasma etching apparatus, a neutral particle etching apparatus, and the like. Besides the apparatuses described above, it is possible to employ an apparatus which wet-etches the sample and an apparatus which etches the sample by use of a corrosive gas.

In FIG. 1, the plasma post-processing apparatus 20 post-processes, such as ashes (i.e. removes photoresist by oxidation), the processed sample processed by the processing apparatus 10 by utilizing plasma under a reduced pressure. Examples of the ash-processing apparatuses which may be employed are a plasma ashing apparatus, non-magnetic field type and magnetic field type microwave plasma ashing apparatuses, an ECR type microwave plasma ashing apparatus, a photo-excitation plasma ashing apparatus, and the like.

In FIG. 1, the wet-processing apparatus 30, such as spinning wet processing apparatus, wet-processes the post-processed sample from the plasma post-processing apparatus 20. In the spinning wet-processing apparatus, the post-processed sample is subjected to spinning washing with water, for example, or to spinning washing sequentially with chemical solutions and water. In this case, the chemical solution is selected suitably in accordance with the materials to be removed from the post-processed sample. An inert gas atmosphere such as nitrogen gas or an atmospheric atmosphere is used as the processing atmosphere. Dry-processing such as water removal is sometimes conducted under this state after wet-processing. According to one aspect of the present invention, a plurality (at least two, e.g., two) of wet-processing stations are represented by wet-processing.

In FIG. 1, an apparatus for dry-processing the wet-processed sample from the wet-processing apparatus 30, such as an apparatus for heating and drying the wet-processed sample or an apparatus for blowing a dry gas on the wet-processed sample to dry it, is used as the dry-processing apparatus 40. A nitrogen gas atmosphere or atmospheric atmosphere is used as the processing atmosphere.

In FIG. 1, the sample transfer means 50 has the function of transferring the processed sample between a processing station (not shown) of the processing apparatus 10 and a processing station (not shown) of the plasma post-processing apparatus 20. The sample transfer means 60 has the function of transferring the post-processed sample between a processing station (not shown) of the plasma post-processing apparatus 20 and a processing station (not shown) of the wet-processing apparatus 30. The sample transfer means 70 has the function of transferring the wet-processed sample between a processing station of the wet-processing apparatus 30 and a processing station (not shown) of the dry-processing apparatus 40. The sample transfer means 50 can deliver and receive the sample between the processing station of the processing apparatus 10 and that of the plasma post-processing apparatus 20. The sample transfer means 60 can deliver and receive the sample between the processing station of the plasma post-processing apparatus 20 and that of the wet-processing apparatus 30. The sample transfer means 70 can deliver and receive the sample between the processing station of the wet-processing apparatus 30 and that of the dry-processing apparatus 40. Known transfer means are used as the sample transfer means 50, 60, 70. Examples of such means include an arm conveyor equipped with sample scooping members that pick up and hold the sample which are rotated or reciprocated mechanically, electrically or magnetically, or with sample grippers or sample adsorbers that grip and hold the sample at their outer peripheral edge by electromagnetic adsorption or vacuum adsorption, for example, a belt conveyor having an endless belt spread between a driving roller and a driven roller, an apparatus for transferring the sample by blow force of gas, and the like. If the processing apparatus 10 is the apparatus which processes the sample by utilizing plasma under a reduced pressure, the sample transfer means 50 is disposed in such a manner that the processed sample can be transferred inside a reduced pressure space without being exposed to the external air.

In this case, there are shown disposed in FIG. 1 the sample transfer means 80, which transfers the sample to be processed by the processing apparatus 10 thereto, and the sample transfer means 90, for transferring the sample dry-processed by the dry-processing apparatus 40 to a recovery cassette (not shown), for example. Sample transfer means analogous to the sample transfer means 50, 60 are used as these sample transfer means 80 and 90.

If the processing apparatus 10 in FIG. 1 processes the sample by utilizing plasma under a reduced pressure, for example, the sample processing atmosphere of the processing apparatus 10 can be put in communication with, and cut off from, the space in which the sample to be processed by the processing apparatus 10 is transferred thereto and the space in which the processed sample is transferred. The sample processing atmosphere of the plasma post-processing apparatus 20, the space in which the processed sample is transferred and the space in which the post-processed sample is transferred can be put in communication with, and cut off from, one another. The space in which the post-processed sample is transferred, the sample wet-processing atmosphere of the wet-processing apparatus 30, the space in which the wet-processed sample is transferred, the sample dry-processing atmosphere of the dry-processing apparatus 40 and the space to which the dry-processed sample is transferred may be maintained in communication with one another or may be put in communication with, and cut off from, one another.

In FIG. 1, the processing station is disposed in the sample processing atmosphere of the processing apparatus 10. If the sample processing apparatus 10 processes the sample by utilizing plasma under a reduced pressure, the processing station is a sample table (not shown). The sample table (not shown) is disposed as the processing station in each of the processing atmosphere of the plasma post-processing apparatus 20, the wet-processing apparatus 30 and the dry-processing apparatus 40. One or a plurality of samples can be put on each sample table. In the processing apparatus 10 and in the plasma post-processing apparatus 20, each sample table is sometimes used as one of the constituent elements forming the sample processing atmosphere.

An embodiment will be explained in further detail with reference to FIGS. 2 and 3.

Figure 2:
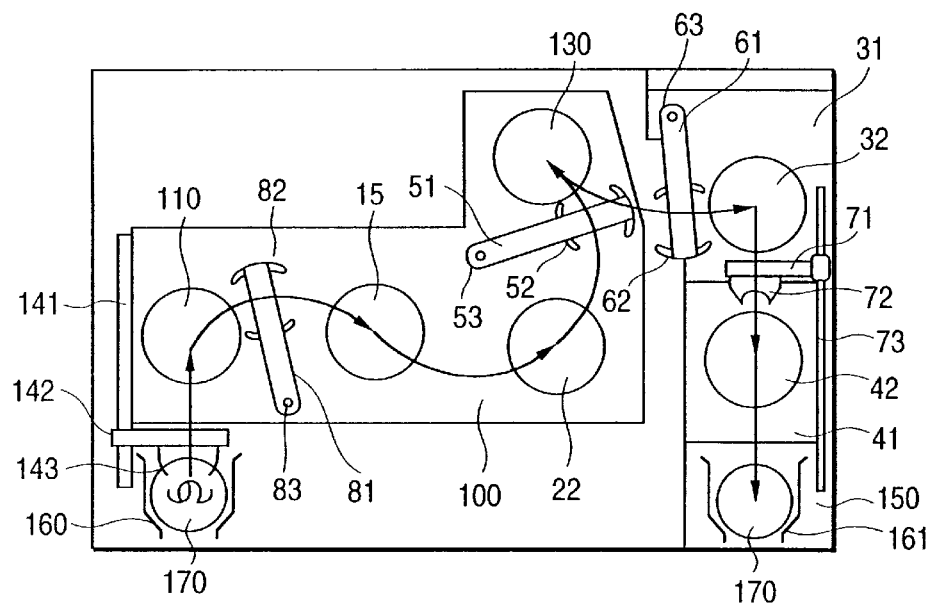
FIG. 2 is a diagrammatic plan view of the apparatus of FIG. 1.
Figure 3:
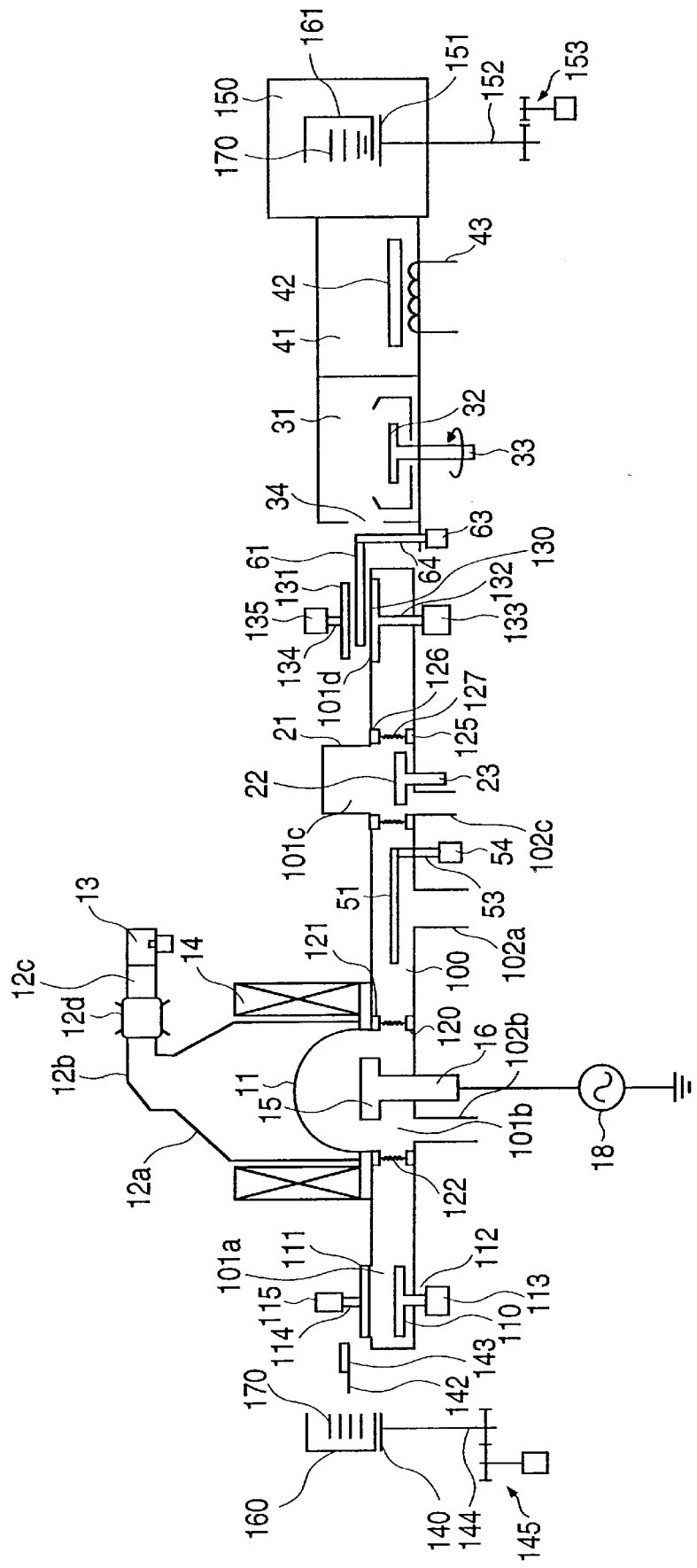
FIG. 3 is a diagrammatic longitudinal side view of the apparatus shown in FIG. 2.

In FIGS. 2 and 3, an apparatus for processing the sample by utilizing plasma under a reduced pressure is used as the processing apparatus in this case.

In FIGS. 2 and 3, four openings 101a, 101b, 101c and 101d are formed in the top wall of a buffer chamber 100. An exhaust nozzle 102a is disposed on the bottom wall of the buffer chamber 100. One of the ends of an exhaust pipe (not shown) is connected to the exhaust nozzle 102a and its other end, to a suction port of an evacuation apparatus (not shown) such as a vacuum pump. The planar shape of the buffer chamber 100 is substantially L-shaped. The buffer chamber 100 is made of a stainless steel in this case. When the buffer chamber 100 is viewed on a plan view, the openings 101a, 101b, 101c are formed from the major side to minor side of the L shape and the opening 101d is formed on the minor side of the L shape. The openings 101a–101d have predetermined gaps between the adjacent pairs of them. An arm 81 is disposed rotatably inside the buffer chamber 100. The arm 81 can rotate in one plane in the buffer chamber 100. A sample scooping member 82 is disposed at the rotating end of the arm 81. The sample scooping member 82 has shaped elements opposed in a plane. The orbit of rotation substantially at the center of the sample scooping member 82 is positioned in such a manner as to substantially correspond to the center of each opening 101a, 101b. In other words, the support point of rotation of the arm 81 is positioned so that almost the center of the sample scooping member 82 describes the orbit of rotation described above. The support point of rotation of the arm 81 is positioned at the upper end of a rotary shaft 83 whose upper end projects at that position into the buffer chamber 100, whose lower end projects outside the buffer chamber 100 and which is disposed rotatably on the bottom wall of the buffer chamber 100 while keeping air-tightness. The lower end of the rotary shaft 83 is connected to rotation driving means (not shown) which is disposed outside the buffer chamber 100 in such a manner as to correspond to the bottom wall of the buffer chamber 100. An arm 51 is disposed rotatably inside the buffer chamber 100 at a position different from that of the arm 81 and on the opposite side of the sample path. The arm 51 can rotate in the same plane in the buffer chamber 100 as the arm 81. A sample scooping member 52 is disposed at the rotating end of the arm 51. The planar shape of the sample scooping member 52 is substantially the same as that of the sample scooping member 82. The arm 51 is disposed in such a manner that the orbit of rotation at the center of the sample scooping member 52 corresponds substantially to the center of each opening 101b, 101c, 101d. In other words, the support point of rotation of the arm 51 is positioned at such a position where almost the center of the sample scooping member 52 describes the orbit of rotation described above. The support point of rotation of the arm 51 is positioned at the upper end of a rotary shaft 53 which is disposed rotatably on the bottom wall of the buffer chamber 100 while keeping air-tightness inside the buffer chamber 100 with its upper end projecting at that position into the buffer chamber 100 and with its lower end projecting outside the buffer chamber 100. The lower end of the rotary shaft 53 is connected to a driving shaft of a rotation driving means disposed outside the buffer chamber 100 so as to correspond to the bottom wall of the buffer chamber 100, such as a driving shaft of a motor 54.

In FIG. 3, a sample table 110 and a cover member 111 are disposed in such a manner as to interpose the opening 101a between them. The sample table 110 has a sample disposition surface on its surface. The planar shape and size of the sample table 110 are such that they can close the opening 101a. The sample table 110 is disposed inside the buffer chamber 100 in such a manner as to be capable of opening and closing the opening 101a, and, in this case, is capable of moving up and down.

An elevation shaft 112 has its axis at the center of the opening 101a with its upper end projecting into the buffer chamber 100 and with its lower end projecting outside the same and is disposed on the bottom wall of the buffer chamber 100 in such a manner that it can move up and down while keeping air-tightness inside the buffer chamber 100. The sample table 110 is disposed substantially horizontally at the upper end of the elevation shaft 112 with its sample disposition surface being the upper surface. The lower end of the elevation shaft 112 is connected to elevation driving means, such as a cylinder rod of a cylinder 113, which is disposed outside the buffer chamber 100 in such a manner as to correspond to the bottom wall of the latter. A seal ring (not shown) is disposed around the outer periphery of the upper surface of the sample table 110 or the inner surface of the top wall of the buffer chamber 100 opposed to the former, that is, on the inner surface of the top wall of the buffer chamber 100 around the opening 101a.

A sample delivery member (not shown) is disposed on the sample table 110. The sample delivery member is disposed in such a manner as to be capable of moving up and down between a position lower than the sample disposition surface of the sample table 110 and a position which projects outward from the opening 101a when the opening 101a is closed by the sample table 110. The planar shape and size of the cover member 111 are such that they can close the opening 101a. The cover member 111 is disposed outside the buffer chamber 100 in such a manner as to be capable of opening and closing the opening 101a, and, in this case, is capable of moving up and down. In the case, an elevation shaft 114 is disposed outside the buffer chamber 100 in such a manner as to be capable of moving up and down with its axis being substantially in conformity with that of the elevation shaft 112. The cover member 111 is disposed substantially horizontally at the lower end of the elevation shaft 114. The upper end of the elevation shaft 114 is connected to elevation driving means, such as a cylinder rod of a cylinder 115, which is disposed above the cover member 111 outside the buffer chamber 100.

A seal ring (not shown) is disposed around the outer periphery of the lower surface of the cover member 111 or the outer surface of the top wall of the buffer chamber 100 opposed to the former, or in other words, around the outer surface of the top wall of the buffer chamber 100 around the opening 101a. The sample table 110 and the cover member 111 are thus doors of an entry airlock of the buffer chamber 100.

A discharge tube 11, whose shape is substantially semispherical in this case, is shown disposed hermetically on the top wall of the buffer chamber 100 in FIG. 3. The shape and size of the opening of the discharge tube 11 are substantially the same as those of the opening 101b, and the opening of the discharge tube 11 is substantially in agreement with the opening 101b. The discharge tube 11 is made of an electric insulator such as quartz. A waveguide 12a is disposed outside the discharge tube 11 to surround it. A magnetron 13 as microwave oscillation means and the waveguide 12a are connected by a waveguide 12b. The waveguides 12a and 12b are made of an electric conductor. The waveguide 12b has an isolator 12c and a power monitor 12d. A solenoid coil 14 as magnetic field generation means is disposed outside and around the waveguide 12b.

A sample table 15 is disposed movably up and down inside the space defined inside the buffer chamber 100 and the discharge tube 11. The axis of an elevation shaft 16 is substantially in agreement with the axis of the discharge tube 11 in this case. The elevation shaft 16 is disposed on the bottom wall of the buffer chamber 100, movably up and down, with its upper end projecting into the buffer chamber 100 and with its lower end projecting outside the buffer chamber 100 while keeping air-tightness inside the buffer chamber 100.

Figure 5A:
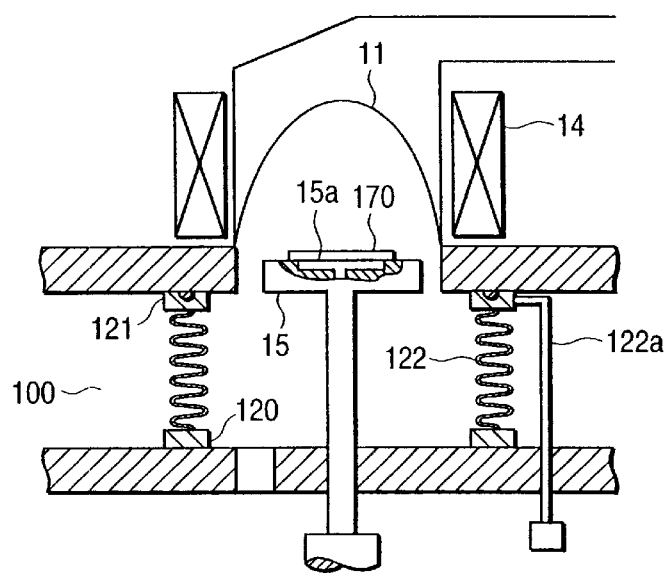
FIGS. 5A and 5B illustrate details of structure and operation of a second part of the apparatus of FIGS. 2 and 3.
Figure 5B:
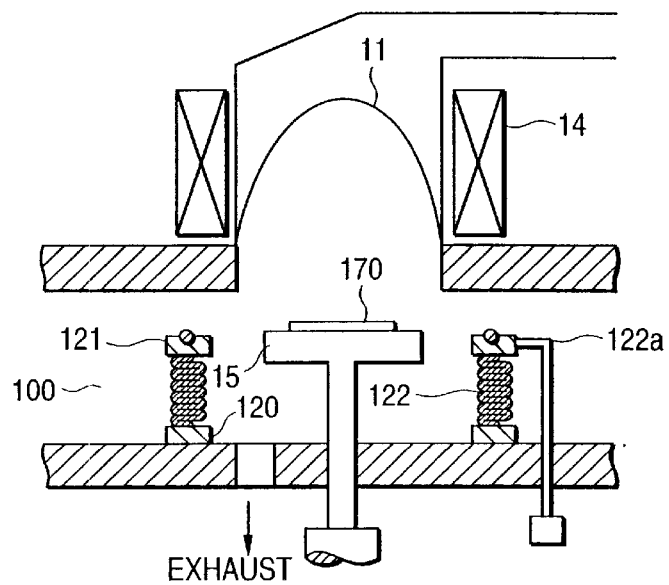

More details of this part of the apparatus are given in FIGS. 5A and 5B, to which reference should be made also.

The sample table 15 has a sample disposition surface on its surface. The planar shape and size of the sample table 15 are such that the sample table 15 can penetrate through the opening 101b. The sample table 15 is disposed substantially horizontally at the upper end of the elevation shaft 16 with its sample disposition surface being its upper surface. The lower end of the elevation shaft 16 is connected to elevation driving means, such as a cylinder rod of a cylinder (not shown), which is disposed outside the buffer chamber 100 in such a manner as to correspond to the bottom wall of the same. In this case, the lower end portion of the elevation shaft 16 is connected to a bias power source, for example, a radio frequency power source 18. The radio frequency power source 18 is disposed outside the buffer chamber 100 and is grounded. In this case, the sample table 15 and the elevation shaft 16 are in an electrically connected state but the buffer chamber 100 and the elevation shaft 16 are electrically isolated.

A sample delivery member 15a (FIG. 5A) is disposed on the sample table 15. The sample delivery member 15a is disposed at a position below the sample disposition surface of the sample table 15 and in such a manner as to be capable of moving up and down with respect to the sample scooping members 82, 52 when the sample disposition surface of the sample table 15 is moved down below the sample scooping member 82 of the arm 81 and the sample scooping member 52 of the arm 51.

The sample table 15 has means for control of temperature. A heat medium flow path is defined inside the sample table 15, for example, and a cooling medium as a heat medium such as cooling water, liquid ammonia, liquid nitrogen, or the like, or a heating medium such as heating gas, is supplied to the flow path. Heat generation means such as a heater, for example, is disposed on the sample table 15.

Flanges 120 and 121 are disposed around the sample table 15 and the elevation shaft 16 inside the buffer chamber 100. The inner diameter and shape of each flange 120, 121 are substantially in conformity with those of the opening 101b. The flange 120 is disposed air-tight on the inner surface of the bottom wall of the buffer chamber 100 with the axis of the elevation shaft 16 being substantially at its center. The flange 121 is disposed in such a manner as to oppose the flange 120. Metallic bellows 122 as extension-contraction cut means are disposed in such a manner as to bridge these flanges 120 and 121.

An elevation shaft 122a is disposed movably up and down with its upper end projecting into the buffer chamber 100 and with its lower end projecting outside the buffer chamber 100 while keeping air-tightness inside the buffer chamber 100. The flange 121 is connected to the upper end of the elevation shaft. The lower end of the elevation shaft is connected to elevation driving means such as a cylinder rod of a cylinder (not shown) disposed outside the buffer chamber 100 in such a manner as to correspond to the bottom wall of the buffer chamber 100.

A seal ring is disposed on the upper surface of the flange 121 or the inner surface of the top wall of the buffer chamber 100 opposing the former, or in other words, on the inner surface of the top wall of the buffer chamber 100 around the opening 101b.

An exhaust nozzle 102b is disposed on the bottom wall of the buffer chamber 100 more inward than the flange 120. One of the ends of an exhaust pipe (not shown) is connected to the exhaust nozzle 102b, and its other end to the suction port of an evacuation apparatus (not shown) such as a vacuum pump. A switch valve (not shown) and a pressure regulating valve such as a variable resistance valve (not shown) are disposed in the exhaust pipe. One of the ends of a gas introduction pipe (not shown) is connected to a processing gas source (not shown), and its other end opens into the discharge tube 11, or the like. A switch valve and a gas flow rate regulator (not shown) are disposed in the gas introduction pipe.

In FIG. 3, the plasma post-processing chamber 21 is hermetically disposed on the top wall of the buffer chamber 100. The shape and size of the opening of the plasma post-processing chamber 21 are substantially in agreement with those of the opening 101c, and the opening of the plasma post-processing chamber 21 is substantially in agreement with the opening 101c. A sample table 22 is disposed in the space defined by the interior of the buffer chamber 100 and that of the plasma post-processing chamber 21. A support shaft 23 in this case uses the axis of the plasma post-processing chamber 21 as its axis. It is disposed on the bottom wall of the buffer chamber 100 with its upper end projecting into the buffer chamber 100 and with its lower end projecting outside the buffer chamber 100 while keeping air-tightness inside the buffer chamber 100.

The sample table 22 has a sample disposition surface on its surface. The planar shape and size of the sample table 22 are smaller than those of the opening 101c in this case. The sample table 22 is disposed substantially horizontally at the upper end of the support shaft 23 with its sample disposition surface being the upper surface. The sample disposition surface of the sample table 22 is positioned below the sample scooping member 52 of the arm 51.

A sample delivery member (not shown) is disposed on the sample table 22. In other words, the sample delivery member is disposed movably up and down between a position lower than the sample disposition surface of the sample table 22 and a position higher than the sample scooping member 52 of arm 51.

Flanges 125 and 126 are disposed outside the sample table 22 and the support shaft 23 but inside the buffer chamber 100. The inner diameter and shape of each flange 125, 126 are substantially in conformity with those at the opening 101c. The flange 125 is disposed hermetically on the inner surface of the bottom wall of the buffer chamber 100 substantially coaxial with the axis of the support shaft 23. The flange 126 opposes the flange 125. Metallic bellows 127 as extension-contraction cut means bridge between these flanges 125 and 126. An elevation shaft (not shown) is disposed movably up and down on the bottom wall of the buffer chamber 100 with its upper end projecting into the buffer chamber 100 and with its lower end projecting outside the buffer chamber 100 while keeping air-tightness inside the buffer chamber 100.

The flange 126 is connected to the upper end of the elevation shaft. The lower end of the elevation shaft is connected to elevation driving means such as a cylinder rod of a cylinder (not shown) which is disposed outside the buffer chamber 100 so as to correspond to the bottom wall of the buffer chamber 100. A seal ring (not shown) is disposed on the upper surface of the flange 126 or the inner surface of the top wall of the buffer chamber 100 opposing the upper surface of the flange 126, or, in other words, on the inner surface of the top wall of the buffer chamber 100 around the opening 101c. An exhaust nozzle 102c is disposed on the bottom wall of the buffer chamber 100 which is more inward than the flange 125. One of the ends of an exhaust pipe (not shown) is connected to the exhaust nozzle 102c, and its other end to the suction port of an evacuation apparatus (not shown) such as a vacuum pump.

In FIG. 3, a sample table 130 and a cover member 131 are disposed in such a manner as to interpose the opening 101d between them. This part of the apparatus and its operation are shown in more detail in FIGS. 4A–G, to which reference should be made also. The sample table 130 has a sample disposition surface on its surface. The planar shape and size of the sample table 130 are such that the sample table 130 can sufficiently close the opening 101d. The sample table 130 is disposed movably up and down, in this case, inside the buffer chamber 100 in such a manner as to be capable of opening and closing the opening 101d. In this case, an elevation shaft 132 is disposed movably up and down on the bottom wall of the buffer chamber 100 with its upper end projecting into the buffer chamber 100 and with its lower end projecting outside the buffer chamber 100 while keeping air-tightness inside the buffer chamber 100. The sample table 130 is disposed substantially horizontally at the upper end of the elevation shaft 132 with its sample disposition surface being the upper surface. The lower end of the elevation shaft 132 is connected to elevation driving means such as a cylinder rod of a cylinder 133 which is disposed outside the buffer chamber 100 in such a manner as to correspond to the bottom wall of the buffer chamber 100.

A seal ring is disposed around the outer peripheral edge of the upper surface of the sample table 130 (as shown) or the inside of the top wall of the buffer chamber 100 opposing the outer peripheral edge, that is, on the inner surface of the top wall of the buffer chamber 100 around the opening 101d. A sample delivery member 130a is disposed on the sample table 130. It is disposed movably up and down between a position lower than the sample disposition surface of the sample table 130 and a position projecting outward from the opening 101d under the state where the opening 101d is closed by the sample table 130.

The planar shape and size of a cover member 131 are such that the cover member 131 can open and close the opening 101d. It is disposed movably up and down, in this case, outside the buffer chamber 100. The axis of an elevation shaft 134 is substantially in agreement with that of the elevation shaft 132, in this case. This elevation shaft 134 is disposed movably up and down outside the buffer chamber 100. The cover member 131 is disposed substantially horizontally at the lower end of the elevation shaft 134. The upper end of the elevation shaft 134 is connected to elevation driving means such as a cylinder rod of a cylinder 135 which is disposed at a position above the cover member 131 outside the buffer chamber 100. A seal ring is disposed around the outer peripheral edge of the lower surface of the cover member 131 (as shown) or the outer surface of the top wall of the buffer chamber 100 opposing the former, that is, the outer surface of the top wall of the buffer chamber 100 around the opening 101d. The sample table 130 and the cover member 131 thus constitute doors of an exit airlock for the buffer chamber 100.

A cassette table 140 is disposed movably up and down in such a manner as to correspond to the side surface of the L-shaped major side of the buffer chamber 100 outside the buffer chamber 100. A guide 141 is disposed outside the buffer chamber 100 in such a manner as to extend linearly along the side surface of the L-shaped major side in its transverse direction. The edge of this guide 141 on the side of the cassette table 140 is extended so as to correspond to the center of the cassette table 140, in this case. An arm 142 is a linear member in this case, and one of its ends is disposed on the guide 141 in such a manner as to be capable of reciprocation while being guided by the guide 141. A sample scooping number 143 is disposed at the other end of the arm 142. The cassette table 140 is disposed substantially horizontally at the upper end of an elevation shaft 144 with a cassette disposition surface being its upper surface. The lower end of the elevation shaft 144 is connected to elevation driving means 145.

The wet-processing chamber 31, the dry-processing chamber 41 and a sample recovery chamber 150 are disposed outside the buffer chamber 100, in this case. They form a unit connectable to and disconnectable from the buffer chamber unit. The wet-processing chamber 31, the dry-processing chamber 41 and the sample recovery chamber 150 are aligned sequentially along the side walls on the side of the openings 101c, 101d of the buffer chamber 100 in this case. Among them, the wet-processing chamber 31 is disposed at the position closest to the opening 101d.

A sample table 32 is disposed inside the wet-processing chamber 31. A support shaft 33 is disposed rotatably on the bottom wall of the wet-processing chamber 31 with its upper end projecting into the wet-processing chamber 31 and with its lower end projecting outside the wet-processing chamber 31 in such a manner as to keep air-tightness and water-tightness inside the wet-processing chamber 31 in this case. The lower end of the support shaft 33 is connected to a rotary shaft of a motor (not shown) as a rotation driving means, for example.

The sample table 32 has a sample disposition surface on its surface. The sample table 32 is disposed substantially horizontally at the upper end of the support shaft 33 with the sample disposition surface being its upper surface. The sample disposition surface of the sample table 32 is positioned below a sample scooping member 62 of an arm 61.

The sample table 32 is equipped with a sample delivery member (not shown). The sample delivery member is disposed movably up and down between a position below the sample disposition surface of the sample table 32 and a position above the sample scooping member 62 of the arm 61. A processing liquid feed pipe (not shown) is disposed inside the wet-processing chamber 31 in such a manner as to be capable of supplying a processing solution to the sample disposition surface of the sample table 32. A processing solution feed apparatus (not shown) is disposed outside the wet-processing chamber 31. The processing solution feed pipe is connected to this processing solution feed apparatus. A waste liquor discharge pipe (not shown) is connected to the wet-processing chamber 31. In this case, inert gas introduction means (not shown) for introducing an inert gas such as nitrogen gas into the wet-processing chamber 31 are provided.

In FIGS. 2 and 3, the arm 61 is disposed rotatably so as to correspond to the sample tables 130 and 32. The arm 61 can rotate on the same plane outside the buffer chamber 100. The sample scooping member 62 is disposed at the rotating end of the arm 61. The planar shape of the sample scooping member 62 is substantially the same as those of the sample scooping members 52 and 82. The arm 61 is disposed in such a manner that the orbit of rotation of the center of the sample scooping member 62 corresponds substantially to the centers of the sample tables 130 and 32, respectively. In other words, the support point of rotation of the arm 61 is positioned to a position where almost the center of the sample scooping member 62 describes the orbit of rotation described above.

The support point of rotation of the arm 61 is disposed at the upper end of the rotary shaft 63 disposed rotatably outside the buffer chamber 100 and outside the wet-processing chamber 31. The lower end of the rotary shaft 63 is connected to the driving shaft of a motor 64, for example, as a rotation driving means. An opening 34 is bored on the side wall of the wet-processing chamber 31 that corresponds to the rotation zones of the arm 61 and sample scooping member 62. The size and position of the opening 34 are such that they do not prevent the entry and exit operations of the arm 61 and sample scooping member 62 with respect to the wet-processing chamber 31. The opening 34 can be opened and closed by switch means (not shown) in this case.

A sample table 42 is disposed inside the dry-processing chamber 41. The sample table 42 has a sample disposition surface on its surface. It is disposed substantially horizontally on the bottom wall of the dry-processing chamber 41. A heater 43 is used as heating means in this case. The heater 43 is disposed on the back of the sample table 42 in such a manner as to be capable of heating the sample table 42. It is connected to a power source (not shown).

The sample disposition surface of the sample table 42 is positioned below a sample scooping member 72 of an arm 71. A sample delivery member (not shown) is disposed on the sample table 42. In other words, the sample delivery member is disposed movably up and down between a position below the sample disposition surface of the sample table 42 and a position above the sample scooping member 72 of the arm 71. In this case, the sample delivery member, too, is capable of moving up and down between a position below the sample disposition surface of the sample table 32 and a position above the sample scooping member 72 of the arm 71. In this case, there is provided inert gas introduction means (not shown) for introducing an inert gas such as nitrogen gas into the dry-processing chamber 41.

A cassette table 151 is disposed inside a sample recovery chamber 150. An elevation shaft 152 is disposed movably up and down on the bottom wall of the sample recovery chamber 150 with its upper end projecting into the sample recovery chamber and with its lower end projecting outside the sample recovery chamber 150. The cassette table 151 is disposed substantially horizontally at the upper end of the elevation shaft 152 with a cassette disposition surface being its upper surface. The lower end of the elevation shaft 152 is disposed on elevation driving means 153. In this case, inert gas introduction means (not shown) are arranged so as to introduce an inert gas such as nitrogen gas into the sample recovery chamber 150.

In FIG. 2, a guide 73 is disposed along the inner wall surface of each of the wet-processing chamber 31, the dry-processing chamber 41 and the sample recovery chamber 150. The guide 73 has a linear shape. In other words, the line passing through the centers of the sample tables 32, 42 and the cassette table 151 is a straight line and the guide 73 is disposed substantially parallel to this line. The arm 71 is a linear member in this case and one of its ends is disposed on the guide 73 so as to be capable of reciprocation while being guided by the guide 73. A sample scooping member 72 is disposed at the other end of the arm 71.

Openings (not shown) are formed on the side walls of the wet- and dry-processing chambers 31, 41 and the sample recovery chamber 150 corresponding to the reciprocation zones of the arm 71 and the sample scooping member 72, respectively, so that the arm 71 and the sample scooping member 72 are not prevented from coming into and out from the wet-processing chamber 31, the dry-processing chamber 41 and the sample recovery chamber 150, respectively. These openings can be opened and closed by switch means (not shown), respectively. An opening for loading and discharging a cassette and a door (not shown) are disposed in the sample recovery chamber 150.

A cassette 160 is disposed on a cassette table 140. It can store a plurality of samples 170 one by one stacked in the longitudinal direction, and one of its side surfaces is open in order to take out the samples 170 from the cassette 160. The cassette 160 is disposed on the cassette table 140 with its sample take-out side surface facing the opening 101a. The cassette table 140 supporting the cassette 160 thereon is moved down, for example, under this state. Descent of the cassette table 140 is stopped at the position where the sample 170 stored at the uppermost stage of the cassette 160 can be scooped up by the sample scooping member 143.

The operation of this apparatus is as follows:

The openings 101a and 101d are closed by the sample tables 110 and 130, respectively, and when an evacuation apparatus is operated under this state, the inside of the buffer chamber 100 is evacuated to a predetermined pressure. Thereafter, the cover member 111 is moved up and this ascent is stopped at the position where the sample scooping member 143 for scooping up the sample 170 is not prevented from reaching the opening 101a. The arm 142 is moved towards the cassette 160 under this state and this movement is stopped at the position where the sample scooping member 143 corresponds to the back of the sample 170 stored at the lowermost stage of the cassette 160, for example. Thereafter the cassette 160 is moved up by the distance at which the sample scooping member 143 can scoop up the sample 170. In this manner the sample 170 is scooped up on its back by the sample scooping member 143 and delivered to the sample scooping member 143.

When the sample scooping member 143 receives the sample 170, the arm 142 is moved towards the opening 101a. This movement of the arm 142 is stopped at the point where the sample scooping member 143 having the sample 170 reaches the position corresponding to the opening 101a. Under this state the sample delivery member of the sample table 110 is moved up so that the sample 170 is delivered from the sample scooping member 143 to the sample delivery member. Thereafter, the sample scooping member 143 is retreated to the position at which it does not prevent descent of the sample delivery member receiving the sample 170 by the movement of the arm 142.

Thereafter the sample delivery member having the sample 170 is moved down and the sample 170 is delivered from the sample delivery member to the sample table 110 and placed on its sample disposition surface. Then, the cover member 111 is moved down. Accordingly, the opening 101a is closed by the cover member 111 and its communication with the outside is cut off. Thereafter, the sample table 110 having the sample 170 is moved down and this downward movement is stopped at the point where the sample table 110 reaches the position at which the sample 170 can be exchanged between the sample delivery member of the sample table 110 and the sample scooping member 82 of the arm 81.

The flange 121 and the metallic bellows 122 are moved down by the shaft 122a lest they prevent the rotation of the arm 81 and the sample scooping member 32 and the sample table 15 is moved down to the position where its sample delivery member 15a and the sample scooping member 82 of the arm 81 can exchange the sample 170 between them. Under this state the sample delivery member 15a is moved up so that it can exchange the sample 170 with the sample scooping member 82 of the arm 81. The arm 81 is then rotated in the direction of the sample table 110 and the sample scooping member 82 is located at the position which corresponds to the back of the sample 170 held by the sample delivery member of the sample table 110 and at which it can scoop up the sample 170. Under this state the sample delivery member of the sample table 110 is moved down and the sample 170 is delivered to the sample scooping member 82 of the arm 81. After scooping up the sample 170, the sample scooping member 82 is rotated in the direction of the sample table 15 while passing between the flange 121 and the inner surface of the top wall of the buffer chamber 100 as the arm 81 is rotated in the direction of the sample table 15.

The sample table 110 is moved up once again so that the opening 101a is closed by the sample table 110. The rotation of the sample scooping member 82 described above is stopped when the sample scooping member 82 reaches the position where the sample 170 can be exchanged between the sample scooping member 82 and the sample delivery member 15a of the sample table 15. The sample delivery member 15a of the sample table 15 is moved up under this state so that the sample 170 is delivered from the sample scooping member 82 to the sample delivery member 15a of the sample table 15. Thereafter, when the arm 81 is rotated to the position between the openings 101a and 101b, the sample scooping member 82 is brought into the stand-by state to prepare for the next delivery of the sample between the sample tables 110 and 15.

Thereafter the flange 121 and the metallic bellows 122 are moved up by the shaft 122a so that communication of the buffer chamber 100 in the metallic bellows 122 and the inside of the discharge tube 11 with the interior of the buffer chamber 100 outside the metallic bellows 122 is cut off. When the sample delivery member 15a of the sample table 15 receiving the sample 170 is moved down, the sample 170 is delivered from the sample delivery member 15a of the sample table 15 to the sample table 15 and is placed on the sample disposition surface of the sample table 15. After receiving the sample 170 on its sample disposition surface, the sample table 15 is moved up to a predetermined position (see FIG. 5A) inside the space where communication with the buffer chamber 100 outside the metallic bellows 122 is cut off.

A predetermined processing gas is introduced at a predetermined flow rate from the processing gas source into the space in which communication with the buffer chamber 100 outside the metallic bellows 122 is cut off. Part of the processing gas introduced into this space is exhausted outside the space due to the operations of the evacuation apparatus and the variable resistance valve. In this manner the pressure of this space is controlled to a predetermined pressure for etching treatment.

The magnetron 13 oscillates a 2.45 GHz microwave in this case. The microwave thus oscillated propagates through the waveguides 12b and 12a through the isolator 12c and the power monitor 12d and is absorbed by the discharge tube 11, thereby generating a radio frequency field containing the microwave. At the same time, the solenoid coil 14 is operated to generate a magnetic field. The processing gas existing inside the space where communication with the buffer chamber 100 outside the metallic bellows 122 is cut off is converted to plasma due to the synergistic operations of the radio frequency field containing the microwave and the magnetic field. The sample 170 disposed on the sample table 15 is etched by utilizing this plasma.

Thereafter the sample table 15 and the flange 121 are moved downwardly (FIG. 5B) and the sample delivery member 15a is moved upwardly.

The rotation of the sample scooping member 52 is stopped at the point when the sample scooping member 52 reaches the position where the etched sample 170 can be exchanged between the sample scooping member 52 and the sample delivery member 15a of the sample table 15. The sample delivery member 15a of the sample table 15 is moved down under this state and the etched sample 170 is delivered from the sample delivery member 15a of the sample table 15 to the sample scooping member 52 of the arm 51. After scooping up the etched sample 170, the sample scooping member 52 is rotated in the direction of the sample table 22 while passing between the flange 121 and the inner surface of the top wall of the buffer chamber 100 as the arm 51 is rotated in the direction of the sample table 22.

A new sample in the cassette 160 is placed by the operations described above on the sample table 15 from which the etched sample 170 is removed. The new sample placed on the sample table 15 is subsequently etch-processed due to the operations described above.

Before, or during, the rotation of the sample scooping member 52 having the etched sample 170, the flange 126 and the metallic bellows 127 are moved down lest they prevent the rotation of the arm 51 and the sample scooping member 52. The radio frequency power source 18 is operated at the time of etching of the sample 170, a predetermined radio frequency power is applied to the sample table 15 through the elevation shaft 16 and a predetermined radio frequency bias is applied to the sample 170. The sample 170 is adjusted to a predetermined temperature through the sample table 15.

The operations of the magnetron 13, solenoid coil 14 and radio frequency power source 18, and the like, are stopped at the point where etching of the sample 170 is complete, and introduction of the processing gas into the space whose communication with the inside of the buffer chamber 100 outside the metallic bellows 122 is cut off is stopped. After evacuation of this space is conducted sufficiently, the switch valve constituting the evacuation means is closed. Thereafter, the flange 121 and the metallic bellows 122 are moved down so as not to prevent the rotation of the arm 51 and the sample scooping member 52 and the sample table 15 is moved down to the position where its sample delivery member and the sample scooping member 52 of the arm 51 can exchange the etched sample 170. The sample delivery member of the sample table 15 is then moved up so that it can exchange the etched sample 170 with the sample scooping member 52 of the arm 51. When the arm 51 is rotated under this state in the direction of the sample table 15, the sample scooping member 52 passes between the flange 121 and the inner surface of the top wall of the buffer chamber 100 and is rotated in the direction of the sample table 15.

The sample scooping member 52 having the etched sample 170 is rotated in the direction of the sample table 22 while passing between the flange 126 and the inner surface of the top wall of the buffer chamber 100 when the arm 51 is rotated further in the direction of the sample table 22. Such a rotation of the sample scooping member 52 is stopped when the sample scooping member 52 reaches the position where the etched sample 170 can be exchanged between the sample scooping member 52 and the sample delivery member of the sample table 22. The sample delivery member of the sample table 22 is moved up under this state and the etched sample 170 is delivered from the sample scooping member 52 to the sample delivery member of the sample table 22. Thereafter the sample scooping member 52 is rotated to the position between the openings 101c and 101d and is brought into the stand-by state-.

Thereafter, the flange 126 and the metallic bellows 127 are moved up and the interior of the buffer chamber 100 inside the metallic bellows 127 and the interior of the plasma post-processing chamber 21 are cut off from communication with the interior of the buffer chamber 100 outside the metallic bellows 127. When the sample delivery member of the sample table 22 receiving the etched sample 170 is moved down, the etched sample 170 is delivered from the sample delivery member of the sample table 22 to the sample table 22 and is placed on the sample disposition surface of the sample table 22.

The post-processing gas is introduced at a predetermined flow rate into the space whose communication with the interior of the buffer chamber 100 outside the metallic bellows 127 is cut off, and part of the post-processing gas is exhausted from this space. In this manner the pressure of this space is adjusted to a predetermined post-processing pressure. Thereafter, the post-processing gas existing in this space is converted in this case to plasma due to the operation of a radio frequency field containing a microwave. The etched sample 170 placed on the sample table 22 is post-processed by utilizing this plasma.

After the post-processing of the etched sample is thus complete, introduction of the post-processing gas into the space, which is cut off from the interior of the buffer chamber 100 outside the metallic bellows 127, and conversion to plasma of the post-processing gas are stopped. Then, the flange 126 and the metallic bellows 127 are moved down lest they prevent the rotation of the arm 51 and the sample scooping member 52.

The sample scooping member 52 that is under the stand-by state between the openings 101c and 101d is rotated to the position which does not prevent the rise of the post-processed sample 170 on the sample table 22 and which has passed the sample table 22. The sample delivery member of the sample table 22 is moved up under this state so that the post-processed sample 170 placed on the sample table 22 is delivered to the sample delivery member of the sample table 22. Then, when the arm 51 is rotated in the direction of the sample table 22, the sample scooping member 52 is located to the position at which it can scoop up the sample 170, so as to correspond to the back of the post-processed sample 170 held by the sample delivery member of the sample table 22. The sample delivery member of the sample table 22 is moved down under this state and the post-processed sample 170 is delivered from the sample delivery member of the sample table 22 to the sample scooping member 52 of the arm 51.

After receiving the post-processed sample 170, the sample scooping member 52 is rotated in the direction of the sample table 130 while passing between the flange 126 and the inner surface of the top wall of the buffer chamber 100 when the arm 51 is rotated in the direction of the sample table 130. After the post-processed sample 170 is removed, the next etched sample is placed on the sample table 22 and is then post-processed by utilizing plasma.

Figure 4A:
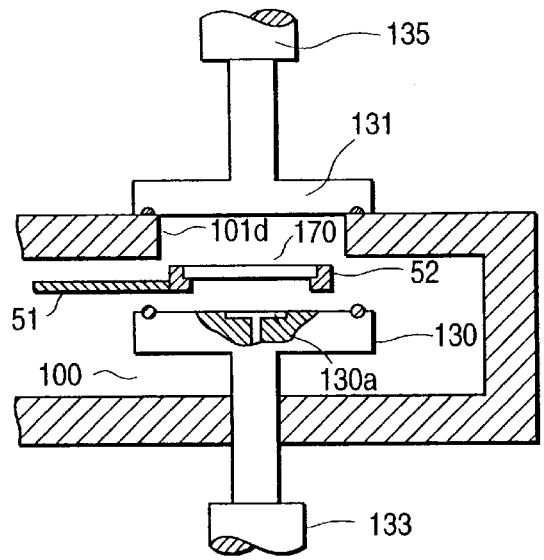
FIGS. 4A–4G illustrate details of structure and operation of one part of the apparatus of FIGS. 2 and 3.
Figure 4B:
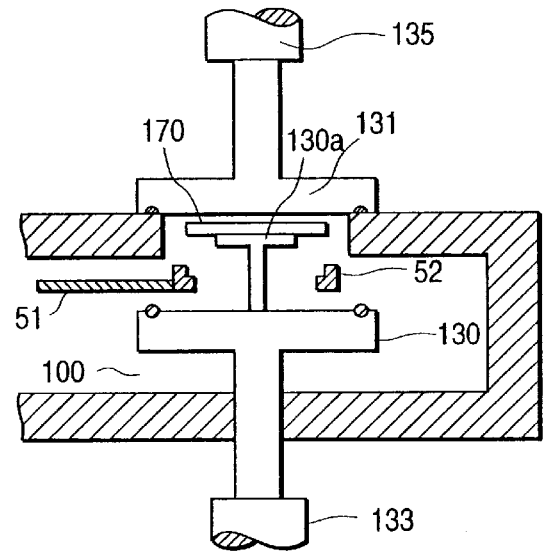

Before, or during, the rotation of the sample scooping member 52 having the post-processed sample 170 as described above, the sample table 130 is moved down to the position at which its sample delivery member 130a and the sample scooping member 52 of the arm 51 can exchange the post-processed sample 170. The rotation of the sample scooping member 52 is stopped when it reaches the position at which the post-processed sample 170 can be exchanged between the sample scooping member 52 and the sample delivery member 130a of the sample table 130 (FIG. 4A). The sample delivery member 130a of the sample table 130 is moved up under this state so that the post-processed sample 170 is delivered from the sample scooping member 52 to the sample delivery member 130a of the sample table 130 (FIG. 4B).

Thereafter, when the arm 51 is rotated to the position between the openings 101b and 101c, the sample scooping member 52 is brought into the stand-by state at that position in order to transfer the next etched sample to the sample table 22.

Figure 4C:
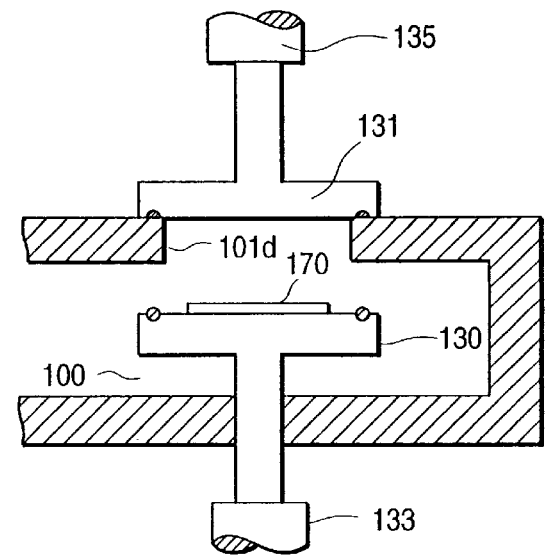
Figure 4D:
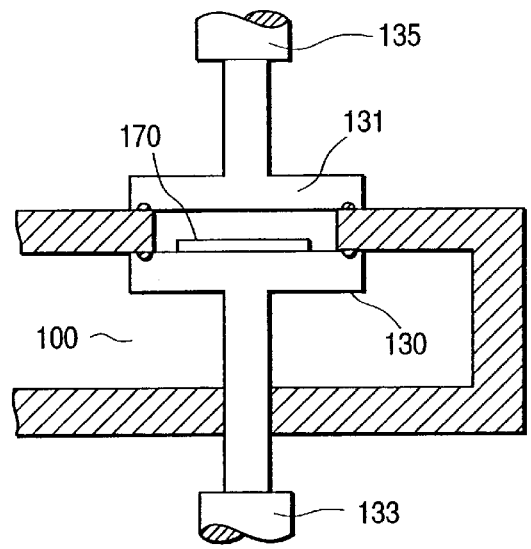
Figure 4E:
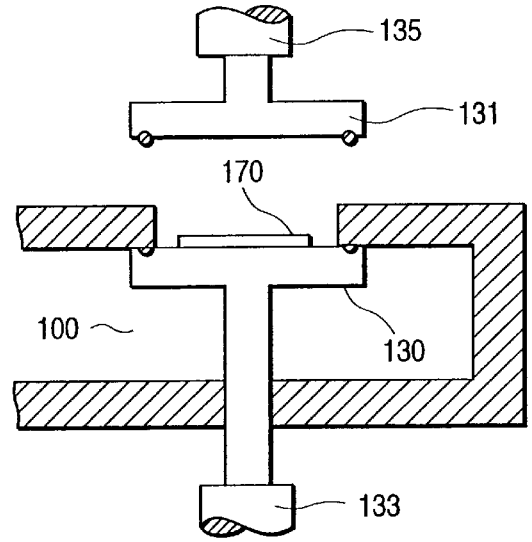
Figure 4F:
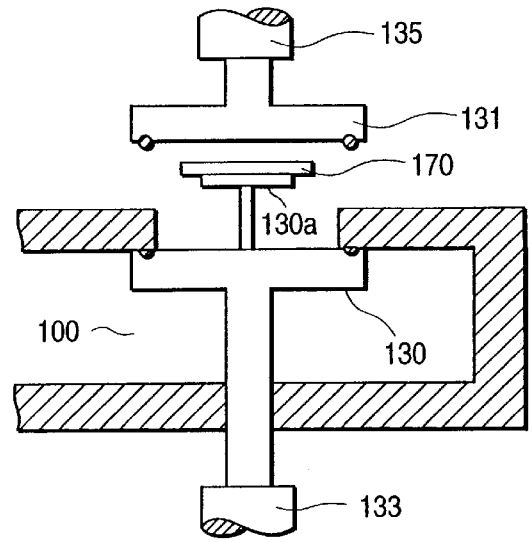

After receiving the post-processed sample 170, the sample delivery member 130a of the sample table 130 is moved down. Accordingly, the post-processed sample 170 is delivered from the sample delivery member 130a of the sample table 130 to the sample table 130 and placed on its sample disposition surface (FIG. 4C). The sample table 130 having the post-processed sample 170 is moved up so that the opening 101d is closed air-tight by the sample table 130 (FIG. 4D). The cover member 131 is moved up under this state. The rise of the cover member 131 is stopped when it reaches the position (FIG. 4E) at which the rise of the sample delivery member 130a of the sample table 130 is not prevented, and, moreover, the sample scooping member 62 of the arm 61 is not prevented from reaching the position where it can receive the post-processed sample 170 from the sample delivery member 130a of the sample table 130. Under this state, the sample delivery member 130a of the sample table 130 is first moved up. Accordingly, the post-processed sample 170 is delivered from the sample table 130 to its sample delivery member 130a (FIG. 4F).

Figure 4G:
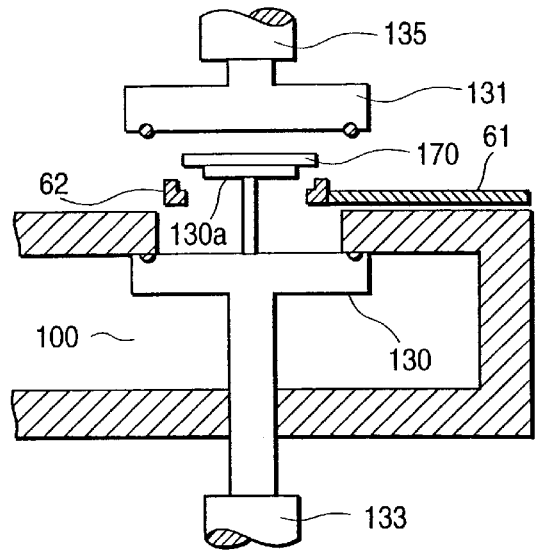

Next, when the arm 61 is rotated in the direction of the sample table 130, the sample scooping member 62 is rotated in the direction of the sample table 130. This rotation of the sample scooping member 62 is stopped when it reaches the position where the post-processed sample 170 can be exchanged between it and the sample delivery member 130a of the sample table 130, or, in other words, the position which corresponds to the back of the post-processed sample 170 held by the sample delivery member 130a of the sample table 130 (FIG. 4G). The sample delivery member 130a of the sample table 130 is then moved down so that the post-processed sample 170 is delivered from the sample delivery member 130a of the sample table 130 to the sample scooping member 62. After receiving the post-processed sample 170, the sample scooping member 62 is rotated towards the sample table 321 inside the wet-processing chamber 31 when the arm 61 is rotated in the direction of the wet-processing chamber 31.

After delivering the post-processed sample 170 to the sample scooping member 62, the sample delivery member 130a of the sample table 130 is further moved down to the position which is below the sample disposition surface of the sample table 130. The cover member 131 is thereafter moved down and the opening 101d is closed air-tight by the cover member 131. The sample table 130 is again moved down under this state and the next post-processed sample is delivered to and placed on this sample table 130.

The rotation of the sample scooping member 62 having the post-processed sample 170 is stopped when it reaches the position at which it can exchange the post-processed sample 170 between it and the sample delivery member of the sample table 32. The sample delivery member of the sample table 32 is moved up under this state. Accordingly, the post-processed sample 170 is delivered from the sample scooping member 62 to the sample delivery member of the sample table 32. After delivering the post-processed sample 170, the sample scooping member 62 is moved outside the wet-processing chamber 31 in order to prepare for acceptance of the next post-processed sample. The opening 34 is then closed.

The sample delivery member of the sample table 32 is moved down after receiving the post-processed sample 170. Accordingly, the post-processed sample 170 is delivered from the sample delivery member of the sample table 32 to the sample table 32 and is placed on its sample disposition surface. The processing solution is then supplied at a predetermined flow rate from the processing solution feed apparatus to the processed surface of the post-processed sample 170 placed on the sample table 32 through the processing solution feed pipe. At the same time, the post-processed sample 170 is rotated by the operation of the motor. In this manner, wet-processing of the post-processed sample 170 is executed.

Nitrogen gas, for example, is introduced into the wet-processing chamber 31 by the inert gas introduction means so that wet-processing is carried out in a nitrogen gas atmosphere. The waste liquor generated by this wet-processing is discharged outside the wet-processing chamber 31 through the waste liquor discharge pipe.

After such a wet-processing is complete, the supply of the processing solution, the rotation of the sample 170, and the like, are stopped, and the sample delivery member of the sample table 32 is moved up. During this rise, the wet-processed sample 170 is delivered from the sample table 32 to its sample delivery member. The rise of the sample delivery member receiving the wet-processed sample 170 is stopped at the position where this sample 170 can be exchanged between the sample delivery member and the sample scooping member 72. The sample scooping member 72 is moved under this state towards the sample table 32. This movement is stopped when the sample scooping member 72 reaches the position where the wet-processed sample 170 can be exchanged between the sample scooping member 72 and the sample delivery member of the sample table 32. The sample delivery member of the sample table 32 is then moved down. Accordingly, the wet-processed sample 170 is delivered to the sample scooping member 72. After the wet-processed sample 170 is removed, the sample delivery member of the sample table 32 prepares for the acceptance of the next post-processed sample.

The sample scooping member 72 having the wet-processed sample 170 is further moved to the dry-processing chamber 41 from the wet-processing chamber 31, passing through the opening towards the sample table 42 through the arm 71. This movement is stopped when the sample scooping member 72 reaches the position at which the wet-processed sample 170 can be exchanged between the sample scooping member 72 and the sample delivery member of the sample table 42. The sample delivery member of the sample table 42 is then moved up. Accordingly, the wet-processed sample 170 is delivered to the sample delivery member of the sample table 42. After the wet-processed sample 170 is removed, the sample scooping member 72 is once moved back and the sample delivery member of the sample table 42 is moved down. Accordingly, the wet-processed sample 170 is delivered from the sample delivery member of the sample table 42 to the sample table 42 and is placed on its sample disposition surface.

The sample table 42 is heated externally by supply of power to the heater 43 and the wet-processed sample 170 is heated through the sample table 42. The temperature of the wet-processed sample 170 is controlled to a predetermined temperature by adjusting the feed quantity to the heater 43. Thus the wet-processed sample 170 is dry-processed. Nitrogen gas, for example, is introduced into the dry-processing chamber 41 by the inert gas introduction means and dry-processing is carried out in the nitrogen gas atmosphere.

After dry-processing is thus complete, the sample delivery member of the sample table 42 is moved up. During this rise, the dry-processed sample 170 is delivered from the sample table 42 to its sample delivery member. The rise of the sample delivery member of the sample table 42 receiving the dry-processed sample 170 is stopped when the dry-processed sample 170 can be exchanged between it and the sample scooping member 72. Under this state, the sample scooping member 72 is again moved towards the sample table 42 through the arm 71. This movement is stopped when the sample scooping member 72 reaches the position at which the dry-processed sample 170 can be delivered between the sample scooping member 72 and the sample delivery member of the sample table 42. The sample delivery member of the sample table 42 is then moved down. Accordingly, the dry-processed sample is transferred to the sample scooping member 72. The sample delivery member of the sample table 42 from which the dry-processed sample 170 is removed prepares for acceptance of the next wet-processed sample.

The sample scooping member 72 having the dry-processed sample 170 is further moved from the dry-processing chamber 41 to the sample recovery chamber 150 through the opening towards the cassette table 151 through the arm 71. This movement is stopped when the sample scooping member 72 reaches the position where the dry-processed sample 170 can be delivered between it and the cassette 161 placed on the cassette table 151.

The cassette 161 has a plurality of storage grooves in the direction of height, for example, and is positioned so that the uppermost groove can accept and store the sample. The cassette 161 is intermittently moved down by a predetermined distance under this stage. Accordingly, the dry-processed sample is supported by the uppermost groove of the cassette 161 and is recovered and stored therein.

Nitrogen gas, for example, is introduced into the sample recovery chamber 150 by the inert gas introduction means so that the dry-processed sample 170 is stored in a nitrogen gas atmosphere and is once preserved in the sample recovery chamber 150. Recovery of the dry-processed samples into the cassette 161 is sequentially conducted; and after this recovery is complete, the cassette 161 is discharged outside the sample recovery chamber 150. The sample thus taken out from the sample recovery chamber 150 while stored in the cassette 161 is transferred to the next step.

EXAMPLE

Figure 6:
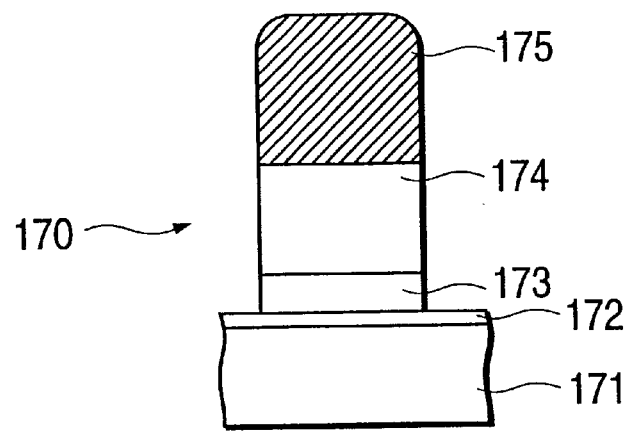
FIG. 6 is a sectional view showing an example of a sample.

The following sample is prepared several times.
First, a 3,000 Å-thick silicon dioxide film 172 is formed on a Si substrate 171 such as shown in FIG. 6, a laminate wiring of a TiW layer 173 and an Al—Cu—Si film 174 is formed on the former and a photoresist 175 is used as a mask. This sample is processed by use of the apparatus shown in FIGS. 2, 3, 4A–4G and 5A and 5B.

The etching conditions are $BCl_3+Cl_2$ as the processing gas, with a flow rate of the processing gas of 150 sccm (standard $cm^3$ per minute), a processing pressure of 16 mtorr, a microwave output of 600 W and a radio frequency bias of 60 W.

The samples which are passed through all the subsequent steps without any processing after etching are referred to as (A), those which are etched, plasma post-processed but are not passed through the wet- and dry-processings are referred to as (B), those which are subjected to the predetermined processings at all the steps are referred to as (D) and those which are not plasma post-processed after etching but are wet- and dry-processed are referred to as (C). The corrosion-proofing effects of these samples are then compared.

The processing conditions in the plasma post-processing chamber are $O_2+CF_4$ as the processing gas, with a flow rate of the processing gas of 400 sccm ($O_2$) and 35 sccm ($CF_4$) and a processing pressure of 1.5 Torr, and the plasma is generated by use of a 2.45 GHz microwave. In this case, the plasma post-processing is mainly intended to ash (remove)

the photoresist and to remove chlorides remaining on the protective film on the pattern sidewall and the pattern bottom portion, and ashing is conducted for about 30 seconds and additional processing under the same condition is conducted for about one minute. In wet-processing, spinning water wash treatment with pure water is conducted for one minute and spinning drying is conducted for 30 seconds. Furthermore, the sample table is heated to 150° C. in the nitrogen gas atmosphere and the wet-processed sample is left standing for the minute for dry-processing.

Figure 7:
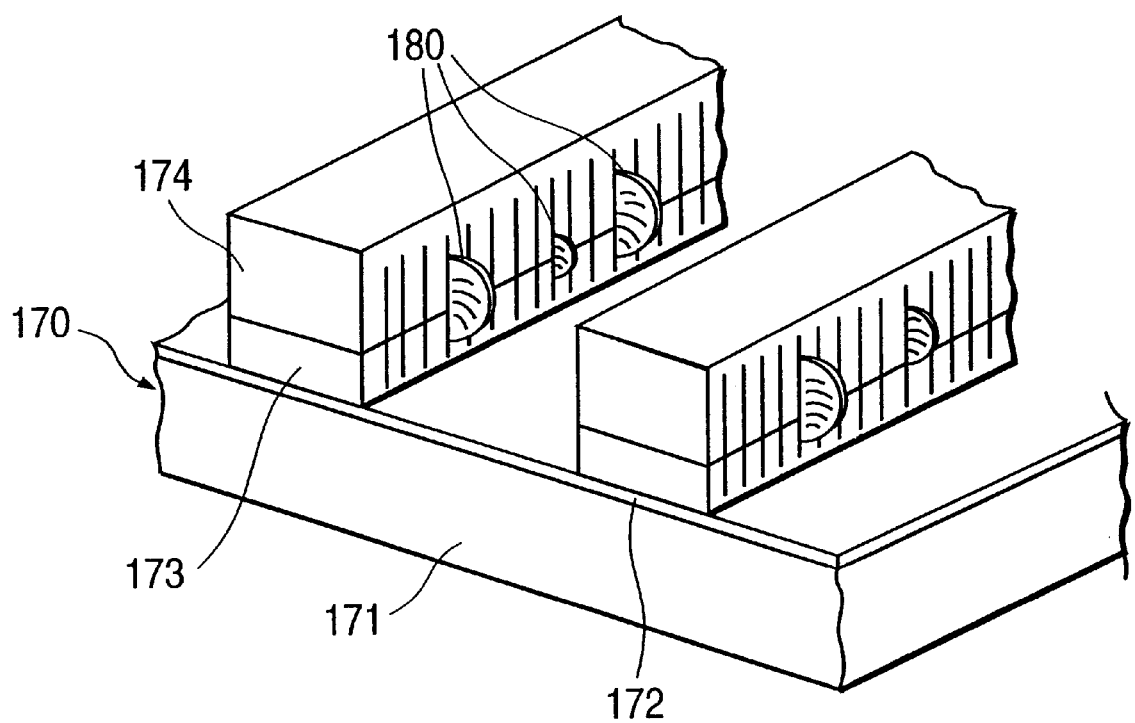
FIG. 7 is a perspective view showing an example of occurrence of corrosion.

When those samples (B) which are etched and then plasma post-processed but are not passed through the wet-processing, that is, water washing treatment and dry-processing, are observed through an optical microscope, spot-like matters analogous to corrosion can be observed within about one hour. Accordingly, they are observed in further detail by SEM. Fan-like corrosion products 180 starting from the boundary between the TiW layer and the Al—Cu—Si layer are observed as shown in FIG. 7. Even though the mixing ratio of $CF_4$ with respect to $O_2$ is changed to from 5 to 20%, the processing pressure is changed to from 0.6 to 2 Torr and the sample temperature is raised to 250° C., corrosion analogous to that described above is observed within a few hours in each case.

It is therefore believed that particularly in a laminate layer wiring, or alloy wiring, containing different kinds of metals having mutually different ionization potentials, corrosion is generated and accelerated by so-called electrolytic corrosion due to battery operation.

To sufficiently prevent the occurrence of such corrosion, it has been found that plasma post-processing alone after etching is not sufficient and even limited amounts of chlorine components must be removed completely.

As described above, therefore, processing was carried out under various conditions to examine the time till the occurrence of corrosion after processing. The result is shown in FIG. 8.

Figure 8:
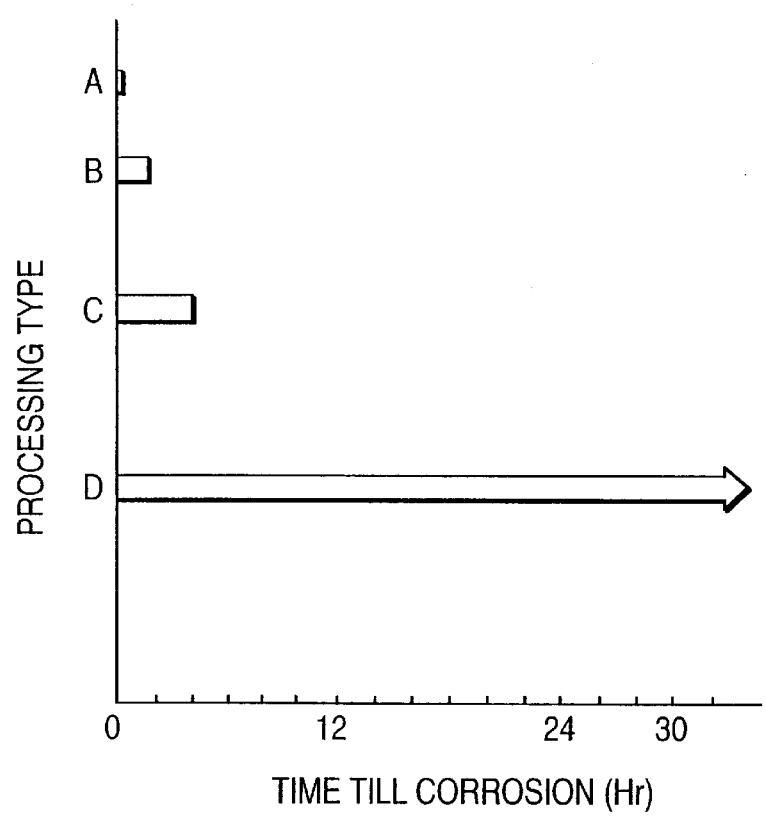
FIG. 8 is a diagram showing the relation between processing modes after etching and the time till occurrence of corrosion.

As can be seen from FIG. 8, in the case of wiring materials such as the laminate layer wiring in which corrosion is vigorous, the plasma post-processing such as resist ashing after etching, or water washing processing and drying processing after etching without carrying out plasma post-processing, cannot provide a sufficient corrosion-proofing effect. A high corrosion-proofing effect for more than 30 hours can only be obtained by carrying out in series the etch-processing, the plasma post-processing such as ashing of the resist, the water washing processing and the dry-processing.

Besides the washing process described above, the same effect of inhibition of corrosion can be obtained by passivation processing with a mixture of nitric acid and hydrogen fluoride or nitric acid, which also serves to remove any residues after plasma etching, before the water washing processing.

In order to remove the reactive products on the pattern sidewall that cannot be removed sufficiently by the plasma post-processing, it is advisable to conduct liquid processing by use of a weakly alkaline solution or a weakly acidic solution (e.g. acetic acid) after plasma post-processing subsequent to etching and then to carry out the water washing processing and dry-processing. In this manner, the chlorine components can be remove more completely and the corrosion-proofing effect can be further improved.

In the embodiment described above, the time till completion of the wet-processing of the plasma post-processed sample is limited to about one hour because corrosion occurs within about one hour as shown in FIG. 8 in the case of the sample shown in FIG. 6. However, wet-processing is preferably completed as quickly as possible. In other words, the plasma post-processed sample is preferably transferred immediately after completion of plasma post-processing from the plasma post-processing apparatus to the wet-processing apparatus. Though the plasma post-processed sample is transferred inside the atmosphere in the embodiment described above, it may be transferred in a vacuum or in an inert gas atmosphere. Transfer in such an atmosphere is extremely effective when the time from plasma post-processing till the start of wet-processing is longer than the corrosion occurrence time in the atmosphere, for example. In such a case, means may be disposed between the plasma post-processing apparatus and wet-processing apparatus for preserving the plasma post-processed sample in a vacuum or in the inert gas atmosphere.

Figure 9:
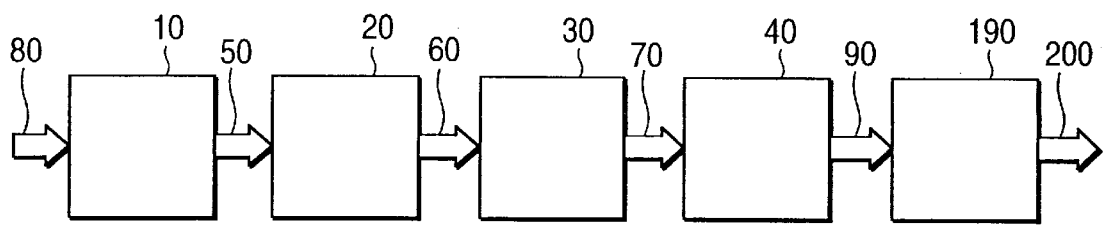
FIG. 9 is a block diagram of a second sample processing apparatus.

FIG. 9 explains a second embodiment. The difference of this embodiment from the first embodiment shown in FIG. 1 lies in that a passivation-processing apparatus 190 is additionally disposed on the downstream side of the dry-processing apparatus 40. In this case, the sample transfer means 90 has the function of transferring the dry-processed sample from the dry-processing chamber (not shown) of the dry-processing apparatus to a passivation-processing chamber (not shown) of the passivation-processing apparatus 190. Additionally, sample transfer means 200 for transferring the passivated sample to a recovery cassette (not shown), for example, is disposed. Like reference numerals are used to identify like constituents as in FIG. 1 and their explanation will be omitted.

In FIG. 9, the etched, plasma post-processed sample (not shown) is transferred into the wet-processing chamber (not shown) of the wet-processing apparatus 30 by the sample transfer means 60 and is placed on the sample disposition surface of the sample table (not shown) as the wet-processing station inside the wet-processing chamber. The plasma post-processed sample placed on the sample table in the wet-processing chamber is subjected to development solution processing. Residues, and the reactive products on the pattern sidewall, after etching are completely removed by such wet-processing. If the sample contains Al as its component, Al, too, is partly dissolved. When such a sample is dry-processed and taken out into the atmosphere, for example, oxidation as a form of corrosion will occur disadvantageously. Therefore, the sample subjected to development and dry-processing in the dry-processing chamber of the dry-processing apparatus 40 is transferred into the passivation-processing chamber of the passivation-processing apparatus 190 and is placed on a sample disposition surface of the sample table (not shown) at the processing station in the passivation-processing apparatus 190. Gas plasma for passivation-processing, or oxygen gas plasma in this case, is generated in or introduced into the passivation-processing chamber. Ozone may be used instead of oxygen. The dry-processed sample placed on the sample table in the passivation-processing chamber is passivation-processed by the oxygen gas plasma. The passivation-processed sample is transferred from the passivation-processing chamber to the recovery cassette by the sample transfer means and recovered and stored therein.

Passivation-processing may use nitric acid, besides the chemicals described above.

Since the present invention can sufficiently remove the corrosive materials generated by etching of the sample, it provides the effect that corrosion of the sample after etching can be prevented sufficiently irrespective of the type of sample.

As described previously, according to the present invention the wet-processing apparatus 30 (see FIG. 1) has plural sample tables, and each of them can carry out parallel processing or series processing (wet-processing) of the samples. A supply means for chemical liquid used for the wet-processing has introduction nozzles, which are classified for acid, alkali and pure water processing liquids, and each chemical liquid is controlled to have a temperature from, e.g., room temperature to 100° C. The processing waste liquid is changed by the acid processing, the alkaline processing and the water processing. Since all operations in this system are controllable by a controller comprising a personal computer provided in this system, the processing sequence, in other words, the flow rate, the flow rate of the chemical liquid, the rotation amount of the spinner and parallel or series processing, etc. can be programmed freely.

Figure 10:
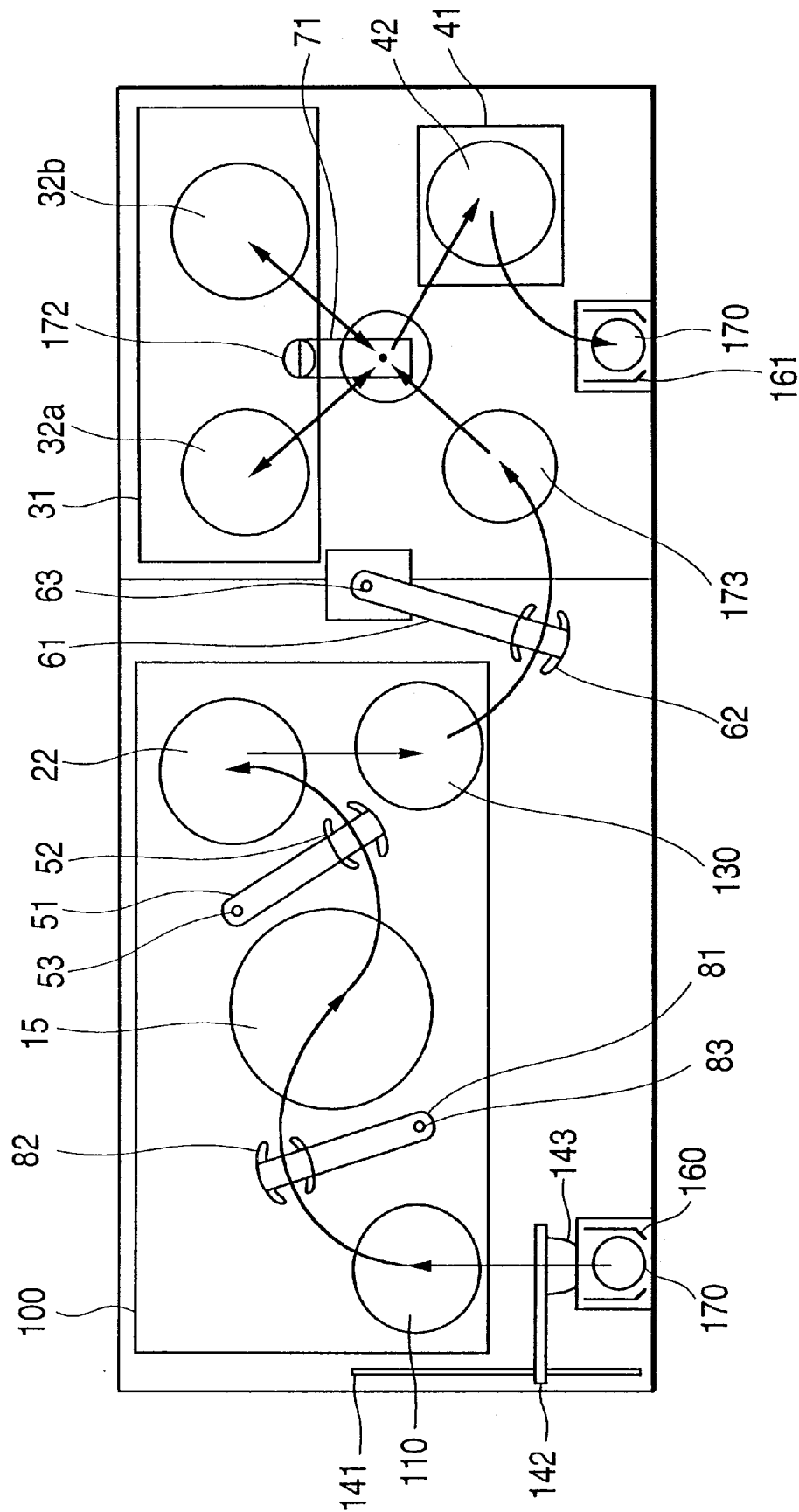
FIGS. 10 and 11 show, respectively, a diagrammatic plan view of apparatus having a plurality of wet-processing means, and a diagrammatic longitudinal side view of the apparatus shown in FIG. 10.
Figure 11:
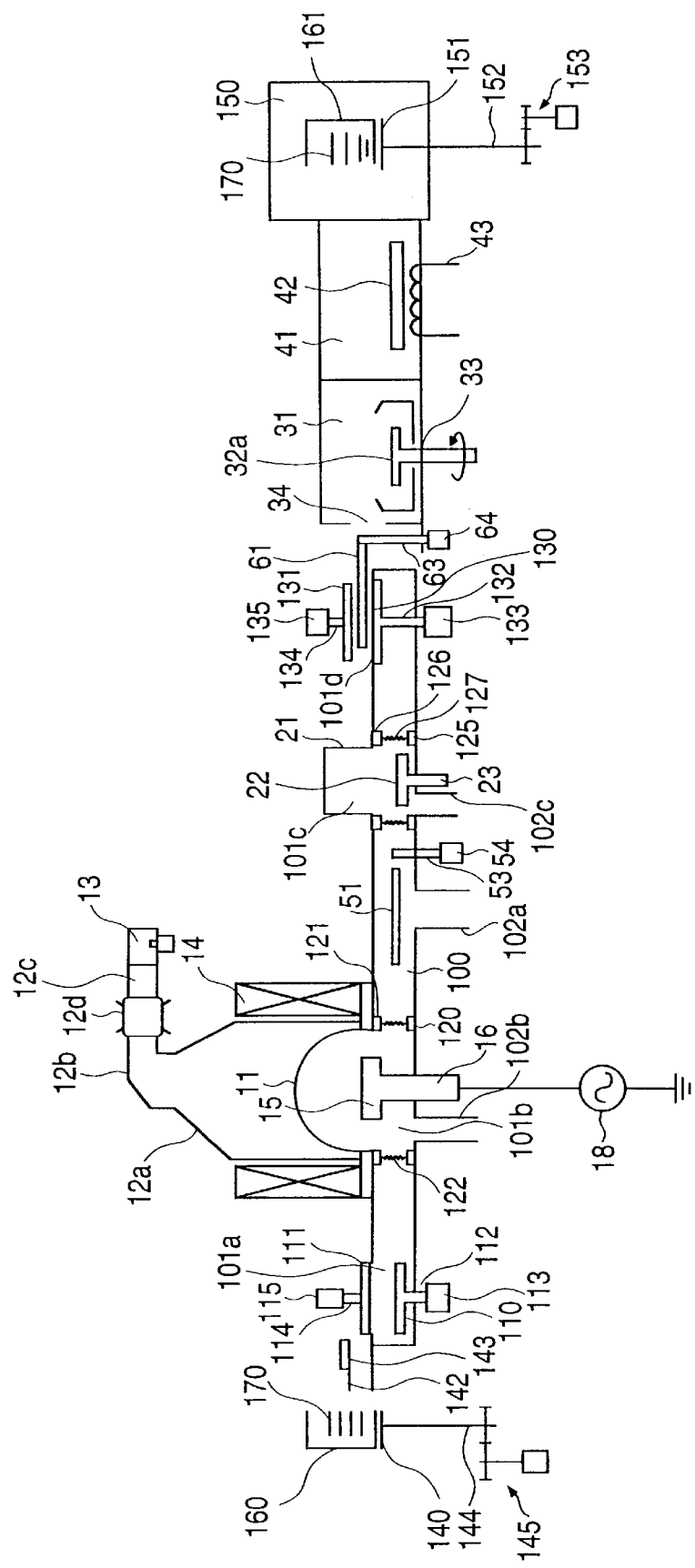

Reference is made to FIGS. 10 and 11, showing this aspect of the present invention having a plurality of wet-processing means (e.g., two-wet processing stations respectively having sample tables 32a and 32b). Reference characters in FIGS. 10 and 11, which are the same as in previously discussed drawing figures in the present application (e.g., FIGS. 2 and 3), represent structure having effectively the same function as previously discussed, and will not be further described except with respect to any differences with the previously discussed structure. Each of sample tables 32a and 32b has a sample installation surface on the respective surface. Each of the sample tables 32a and 32b is provided extending in a substantially horizontal direction, on an upper end of a respective support shaft 33, the respective sample installation surface forming the upper surface of the sample table. The sample installation surface of the respective sample tables 32a and 32b is positioned at a lower portion than the sample scooping member 62 of the arm 61. Each of the sample tables 32a and 32b provides a sample receiving member (not shown in FIGS. 10 and 11), respectively. Note that in FIG. 10, the wet processing room 31 contains the two (2) sample tables 32a and 32b. After treatment on the sample table 130 of the plasma post-processing apparatus, the sample is transferred, e.g., by sample scooping member 62 of the arm 61, to support member 173, by transfer techniques as discussed previously. From support member 173, transfer arm 172 can be used to transfer the sample to sample table 32a or to 32b, depending on availability for the wet processing and whether series or parallel processing is to be carried out.

If series processing is to be performed, the sample is transferred first, e.g., to sample table 32a from support member 173, and thereafter is transferred (after wet-processing on sample table 32a) to sample table 32b for wet-processing on sample table 32b. Thereafter, the sample is transferred to sample table 42 of the dry-processing chamber 41, for processing therein as discussed previously. Of course, treatment with different liquids can be performed at each of sample table 32a and sample table 32b, respectively.

If parallel processing is to be performed, a sample can (alternatively) be transferred from support member 173 to either sample table 32a or sample table 32b by transfer arm 172, depending, e.g., on availability of the sample table. After, e.g., treatment with a plurality of different treatment liquids at the respective sample table 32a or 32b, the sample can be transferred by transfer arm 172 to sample table 42 of the dry-processing chamber 41.

Next will be described a parallel wet-processing particularly useful where the wet-processing takes a longer amount of time than, e.g., a time period required for treatment in buffer chamber 100. This parallel wet-processing will be discussed in connection with FIG. 15. Parallel wet-processing is particularly effective to improve the through output when the period required for the wet-processing is much longer than the period required for other (prior) processes, such as processes in the buffer chamber 100. In order to simplify the explanation of parallel wet-processing, it is assumed that the periods for etching process on the table 15 and ashing process on the table 22 are 120 seconds, that the period for wet-processing on the table 32a or 32b is 240 seconds, and that any periods for transfer of the sample from one location to another location are neglected. Samples A, B, C . . . are sequentially etched on the table 15 every 120 seconds and transferred to table 22 to be ashed there every 120 seconds, as shown in FIGS. 15(*a*) and 15(*b*). Etched and ashed sample A is transferred to the table 32a and rinsed there for 240 seconds. Though ashing for sample B is ended at the half-time point of the period during which sample A is rinsed, the ashed sample B would have to wait to be wet-processed on the table 32a till the wet-processing for Sample A on the table 32a is finished. However, another table 32b is available to wet-process sample B, without the waiting time, since wet-processing for a previous sample on the table 32b has finished by the end of the period for ashing sample B, that is, the half time point of the period for wet-processing sample A. Samples A, B, C, . . . are alternately transferred to tables 32a and 32b with a half time shift of the wet-processing period as shown in FIGS. 15(*c*) and 15(*d*).

The wet-processing for each sample requires 240 seconds which is twice 120 seconds required for the etching or ashing process. Since the rough output of the over-all system is determined by the longest period in the sequential processing, the through output of the system with one wet-processing table is determined by 240 seconds. However, with parallel wet-processing, wet-processing for each sample can be finished every 120 seconds. Since the longest period which determines the through output of the system is shortened by half, the through output is improved.

As seen in the foregoing, sample waiting time, for the wet-processing, can be reduced. Accordingly, through use of the presently disclosed parallel treating the total time, from beginning to end, of processing a sample can be reduced.

Next, a sample processing method using the above sample processing apparatus will be explained. As the sample 170, a 3000 Å-thick silicon dioxide film 172 is formed on a silicon substrate as shown in FIG. 6; on the former a laminated wiring of a TiW layer 173 and an Al—Cu—Si film 174 are formed, and the sample 170 uses a photoresist 175 as a mask.

As the etching processing conditions, the selected conditions are $BCl_3+Cl_2$ as the etching processing gas, a flow rate of the processing gas of 150 sccm, a processing pressure of 16 mTorr, a microwave output of 600 W and RF bias of 60 W.

The samples which are passed through all the subsequent steps without any processing after the etching processing are referred to as (A), those which are plasma post-processed after the etching processing but are not passed through the wet-processing and the dry-processing are referred to as (B), those which are subjected to the predetermined processings at all the steps are referred to as (D), and those which are not plasma post-processed after the etching processing but are wet-processed and dry-processed are referred to as (C). The corrosion-proofing effects of these samples are then compared.

Besides, the processing conditions in the plasma post-processing chamber are $O_2+CF_4$ as the processing gas, a flow rate of the processing gas of 400 sccm ($O_2$) and 35 sccm ($CF_4$) and a processing pressure of 1.5 Torr, and the plasma is generated by use of a 2.45 GHz microwave.

In this case, the plasma post-processing is mainly directed to ashing the photoresist and to remove chlorides remaining on the protective film on the pattern side wall and the pattern bottom portion, and the ashing processing is conducted for about 30 seconds and the additional processing under the same plasma condition is conducted for about one minute.

Further, in the wet-processing, a spinning water wash treatment with pure water is conducted for one minute and the spinning drying is conducted for 30 seconds. Furthermore, the sample table is heated to 150° C. by the heater under the nitrogen gas atmosphere and the wet-processing sample is left standing on it for one minute for the dry-processing.

As a result, when those samples which are etching-processed and then plasma post-processed but are not passed through the wet-processing, that is, the water washing treatment and the dry-processing, are observed through an optical microscope, spot-like matters analogous to the corrosion can be observed within about one hour.

Accordingly, they are observed in further detail by SEM. As a result, fan-like corrosion products 180 starting from the boundary between the TiW layer and Al—Cu—Si layer are observed, as shown in FIG. 7.

Therefore, even though the mixing ratio of $CF_4$ with respect to $O_2$ is changed from 5–20%, the processing pressure is changed from 0.6–2 Torr and the sample temperature is raised to 250° C., corrosion analogous to the one described above is observed within a few hours after the processings in either case.

The corrosion such as described above cannot be observed in an Al—Cu—Si single layer wiring film. It is therefore believed that in the laminated layer wiring of different kinds of metals having mutually different ionization tendencies, the corrosion is generated and accelerated by so-called electrolytic corrosion due to a battery operation.

To sufficiently prevent the occurrence of such corrosion, it has been found that the plasma post-processing alone after the etching processing is not sufficient and even limited amounts of the chlorine components must be removed completely.

As described above, therefore, the processings were carried out under various conditions to examine the time till the occurrence of the corrosion after the processing, and the result shown in FIG. 8 was obtained.

As can be seen from FIG. 8, in the case of the wiring materials such as the laminated layer wiring in which corrosion is vigorous, the plasma post-processing such as a resist ashing after the etching processing, or the water washing processing and the drying processing after the etching processing without carrying out the plasma post-processing, cannot provide a sufficient corrosion-proofing effect.

A high corrosion-proofing effect for more than 30 hours can first be obtained by carrying out in series the etching processing, the plasma post-processing such as the ashing of resist, the water washing processing and the dry-processing.

Further, besides the processing described above, a same effect can be obtained by processing with a mixture of nitric acid and hydrofluoric acid, which also serves to remove any residues after the etching, before the water washing processing.

In order to remove the protective film on the pattern side wall that cannot be removed sufficiently by the plasma post-processing, it is advisable to process the sample by wet-processing using a weakly alkaline solution or a weakly acidic solution (for example, acetic acid), after the plasma post-processing subsequent to etching, and then to carry out the water washing processing and the dry-processing. In this manner, the chlorine components can be removed more completely and the corrosion-proofing effect can be further improved.

Figure 12:
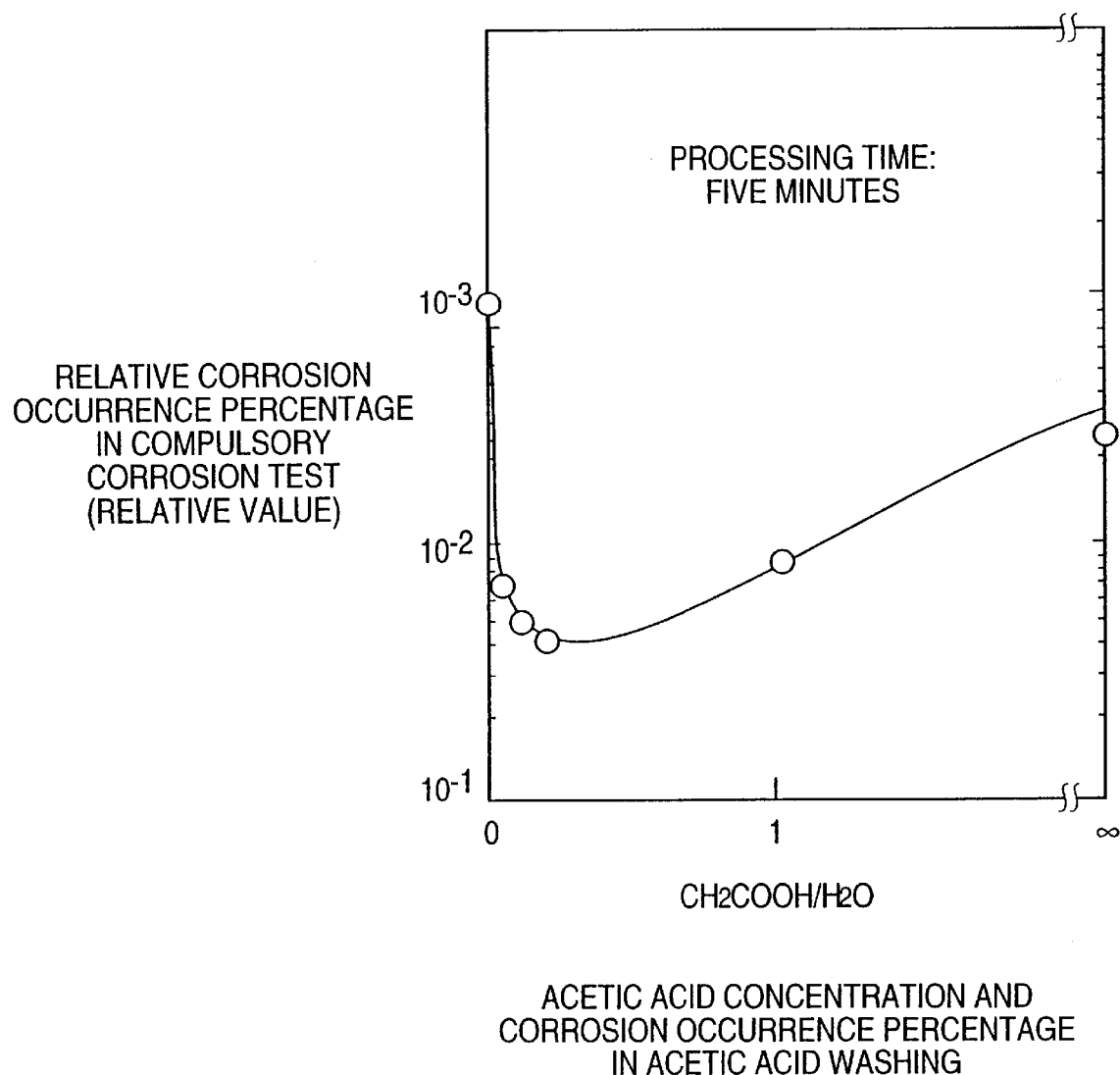
FIG. 12 shows a relationship between corrosion occurrence and acetic acid concentration when the wet processing includes an acetic acid treatment.

In FIG. 12, a relative relation between the acetic acid concentration, and the corrosion occurrence percentage, when wet-processing is conducted using acetic acid, is shown. As can be seen from FIG. 12, when the acetic acid concentration is 10–20%, the corrosion occurrence percentage is a minimum value.

Figure 13:
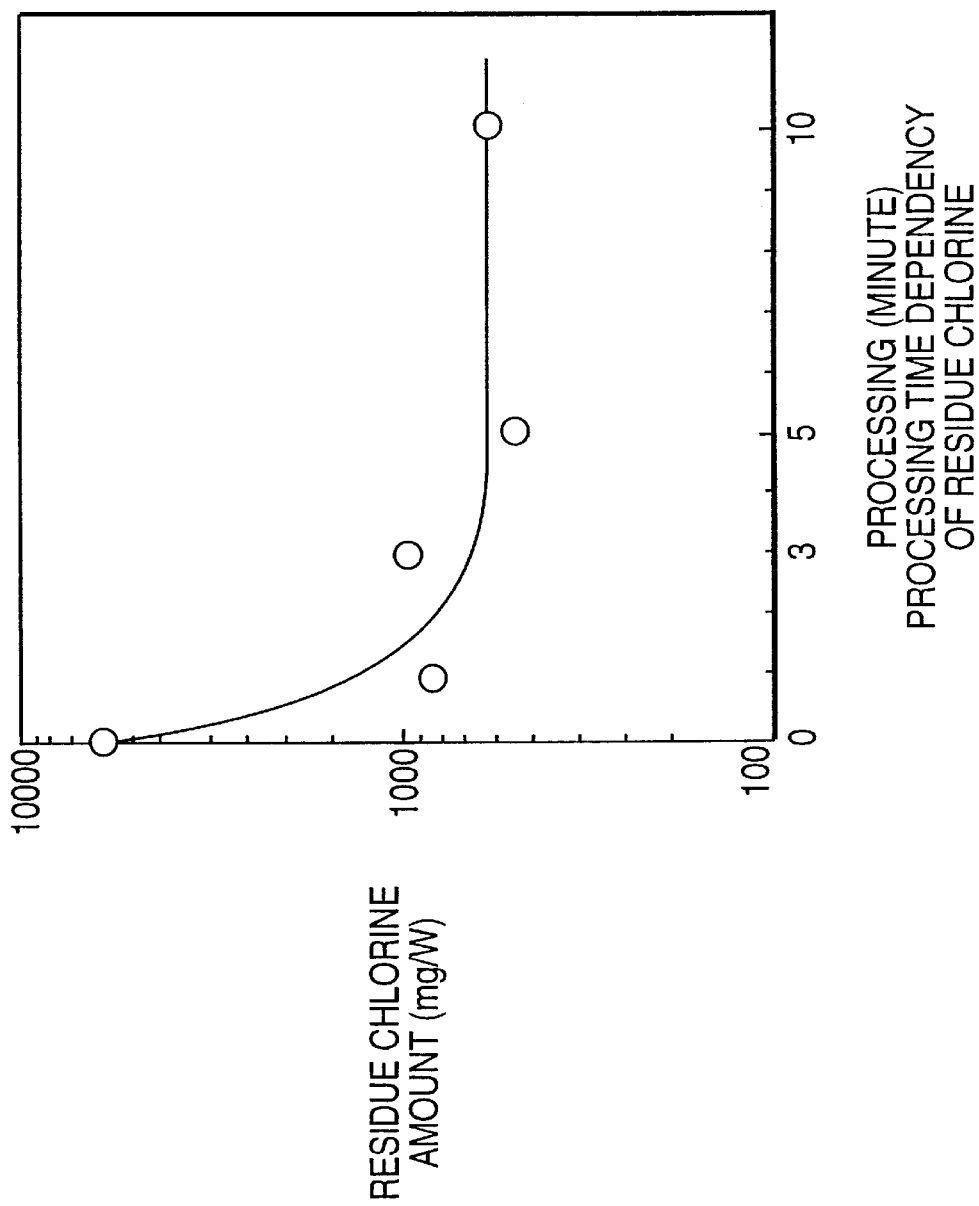
FIG. 13 shows a relationship between processing time and residual chlorine content on the surface of the sample.

Further, in FIG. 13, a relation between processing time and the residue chlorine amounts on the sample surface is shown. As can be seen from FIG. 13, the residue chlorine amount lowers gradually up to 4 minutes from the start of the processing, after which it becomes constant. Accordingly, it can be seen that desirably the processing time (for wet-processing) is more than four minutes.

However, since the total time for both etching processing and ashing processing is one to two minutes, and since four minutes are long remarkably, waiting time for the wet-processing is long where only a single wet-processing station is used. According to the present invention, having a plurality of wet-processing stations and particularly where parallel processing is performed, the through-put is accelerated in this wet-processing so that lowering of the through-put can be avoided.

Moreover, according to the present invention chemical liquid processing and the water washing processing can be conducted in series and successively.

Further, in the case where acetic acid alone is used for chemical wet-processing, during the sample processing the adsorbed chlorine on the sample surface is dissolved in water; a high concentration hydrochloric acid is generated locally and Al is locally etched. Accordingly, in order to not locally etch Al, a buffer liquid comprising a weak acid (for example, acetic acid) and a weak alkali (for example, ammonia) can be used.

Figure 14:
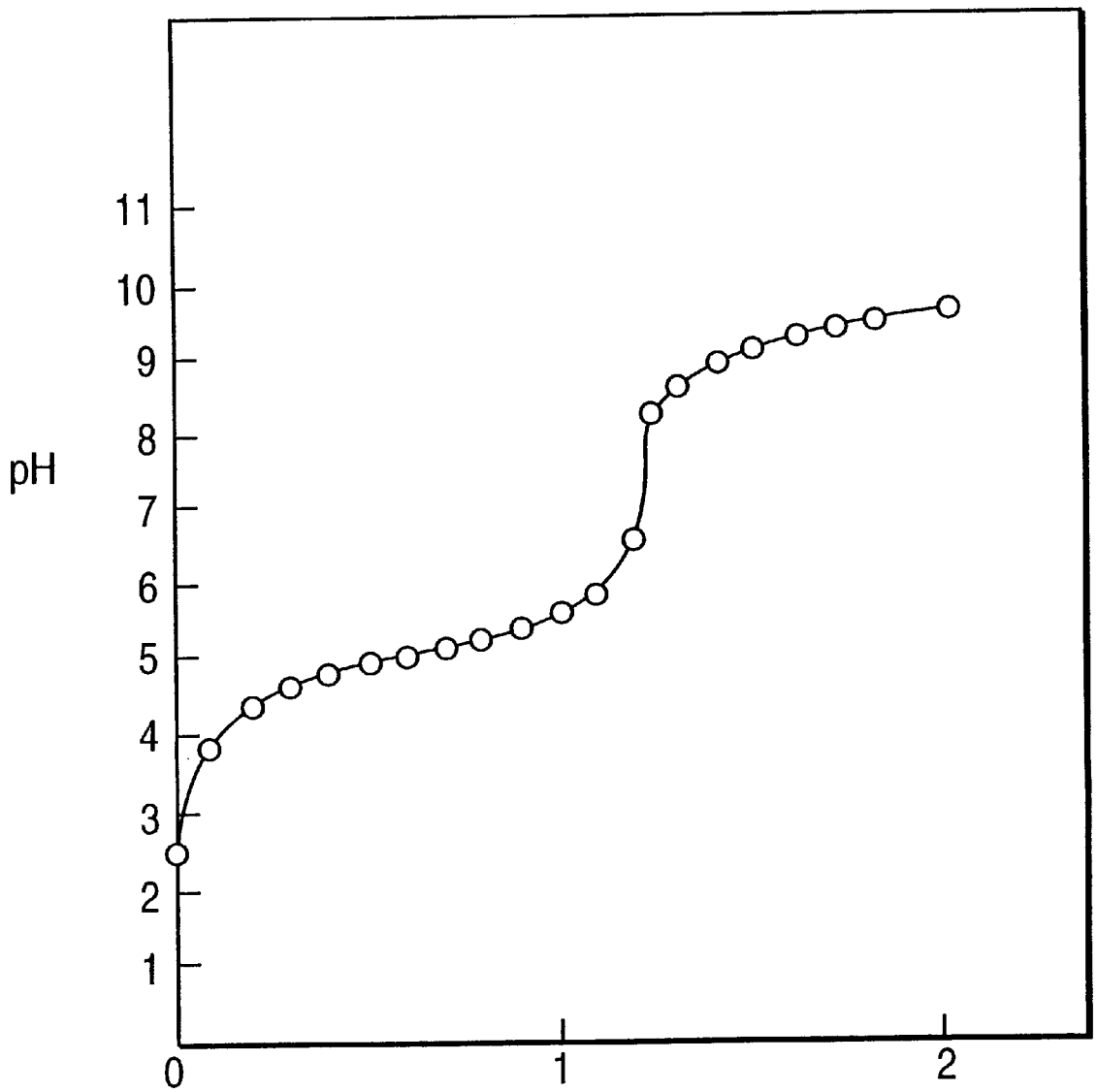
FIG. 14 shows the buffering action of a weak acid-weak alkali buffer liquid.

The buffer action of the acetic acid-ammonia buffer liquid is shown in FIG. 14. corrosion-proofing effect is seen at every buffer concentration. However, in the alkali region Al is etched; accordingly, it is desirable to use the buffer liquid in the acid region.

Further, by increasing the wet-processing temperature, the necessary processing time shown in FIG. 13 can be shortened. At 40° C. the wet-processing requires five minutes; by making the temperature of the processing liquid 80° C. the wet-processing can be obtained effectively in about two minutes. The temperature of the processing liquid can be controlled from room temperature to 100° C., as discussed previously. Accordingly, relatively high temperature liquid wet-processing treatments can be advantageous.

While we have shown and described several embodiments in accordance with the present invention, it is understood that the same is not limited thereto, but is susceptible to numerous changes and modification as known to one having ordinary skill in the art, and we therefore do not wish to be limited to the details shown and described herein, but intend to cover all such modifications as are encompassed by the scope of the appended claims.

We claim:

1. A method of processing a sample having a metal layer including a laminate comprising at least two films of at least two different metals of different ionization tendencies, overlying a semiconductor substrate, and a resist mask on said metal layer, comprising the steps of:

(i) etching said films of the sample through the resist mask by a first plasma, thereby forming sidewalls;

(ii) after step (i), treating the sample by a second plasma which is different from the first plasma, to remove corrosive compounds on said sidewalls;

(iii) passivating the sample etched in step (i) and treated in step (ii); and (iv) further, contacting a surface of said sample etched in step (i) and treated in step (ii) with at least one liquid to remove residual corrosive compounds which were not previously removed.

2. A method of processing a sample according to claim 1, wherein residual corrosive compounds from the etching are left on the sample after the etching, and in step (ii), residual corrosive compounds formed in step (i) are removed and said resist mask is removed.

3. A method of processing a sample according to claim 1, wherein one film of said laminate is a TiW film, and an adjacent film of said laminate is an Al-containing film.

4. A method of processing a sample according to claim 3, wherein the Al-containing film is an Al—Cu—Si film.

5. A method of processing a sample according to claim 4, wherein in etching said sample, said Al—Cu—Si film and said TiW film are etched.

6. A method of processing a sample according to claim 1, wherein, in etching said sample, said at least two films of at least two different metals of different ionization tendencies are each etched.

7. A method of processing a sample according to claim 6, wherein, in etching said sample, said at least two films are each etched through an entire thickness thereof.

8. A method of processing a sample according to claim 1, wherein said corrosive compounds are compounds which can generate and accelerate corrosion, by electrolytic corrosion due to a battery operation occurring in said laminate comprising at least two films of at least two different metals of different ionization tendencies.

9. A method of processing a sample according to claim 1, wherein said at least two films include two adjacent films which are of different metals of different ionization tendencies from each other.

10. A method of processing a sample according to claim 1, wherein the step (iii) of passivating is performed prior to the step (iv) of contacting.

11. A method of processing a sample according to claim 1, wherein the step (iii) of passivating is performed after the step (iv) of contacting, such that the sample etched in step (i), treated in step (ii) and contacted in step (iv) is then passivated in step (iii); and the step (iv) of contacting removes residual corrosive compounds not removed in the step (ii) of treating.

* * * * *